(12) United States Patent
Choi et al.

(10) Patent No.: US 12,426,464 B2
(45) Date of Patent: Sep. 23, 2025

(54) DISPLAY PANEL

(71) Applicant: Samsung Display Co., Ltd., Yongin-si (KR)

(72) Inventors: Seungjoo Choi, Yongin-si (KR); Kyoung-Jun Kim, Hwaseong-si (KR); Hyunjae Yoo, Hwaseong-si (KR); Leeseul Son, Cheonan-si (KR); Sangcheon Han, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 404 days.

(21) Appl. No.: 17/987,155

(22) Filed: Nov. 15, 2022

(65) Prior Publication Data

US 2023/0157106 A1    May 18, 2023

(30) Foreign Application Priority Data

Nov. 16, 2021  (KR) .......................... 10-2021-0157188

(51) Int. Cl.
*H10K 59/131* (2023.01)
(52) U.S. Cl.
CPC ................................. *H10K 59/131* (2023.02)
(58) Field of Classification Search
None
See application file for complete search history.

(56) References Cited

U.S. PATENT DOCUMENTS

| | | | |
|---|---|---|---|
| 8,866,706 B2 | 10/2014 | Kang et al. | |
| 9,117,407 B2 | 8/2015 | Kim | |
| 10,446,636 B2 | 10/2019 | Lee et al. | |
| 2019/0115415 A1 | 4/2019 | Choi et al. | |
| 2021/0272943 A1* | 9/2021 | Lee | H10D 86/441 |

FOREIGN PATENT DOCUMENTS

| | | |
|---|---|---|
| KR | 10-1188999 | 10/2012 |
| KR | 10-2018-0042504 | 4/2018 |
| KR | 10-1951665 | 2/2019 |
| KR | 10-2019-0041553 | 4/2019 |

* cited by examiner

*Primary Examiner* — Kyoung Lee

(57) ABSTRACT

A display panel includes a base layer, pixels including transistors, each of the transistors includes a semiconductor pattern and a gate, and light emitting elements electrically connected to the transistors, data lines electrically connected to corresponding pixels, spaced apart from each other in a first direction, and extending in a second direction intersecting the first direction, bridge lines electrically connected to the data lines, and scan lines and sensing lines electrically connected to the pixels, spaced apart from each other in the second direction, and extending in the first direction. The bridge lines extend in the second direction and overlap the data lines in a plan view in an area in which the scan lines and the sensing lines intersect the data lines.

22 Claims, 22 Drawing Sheets

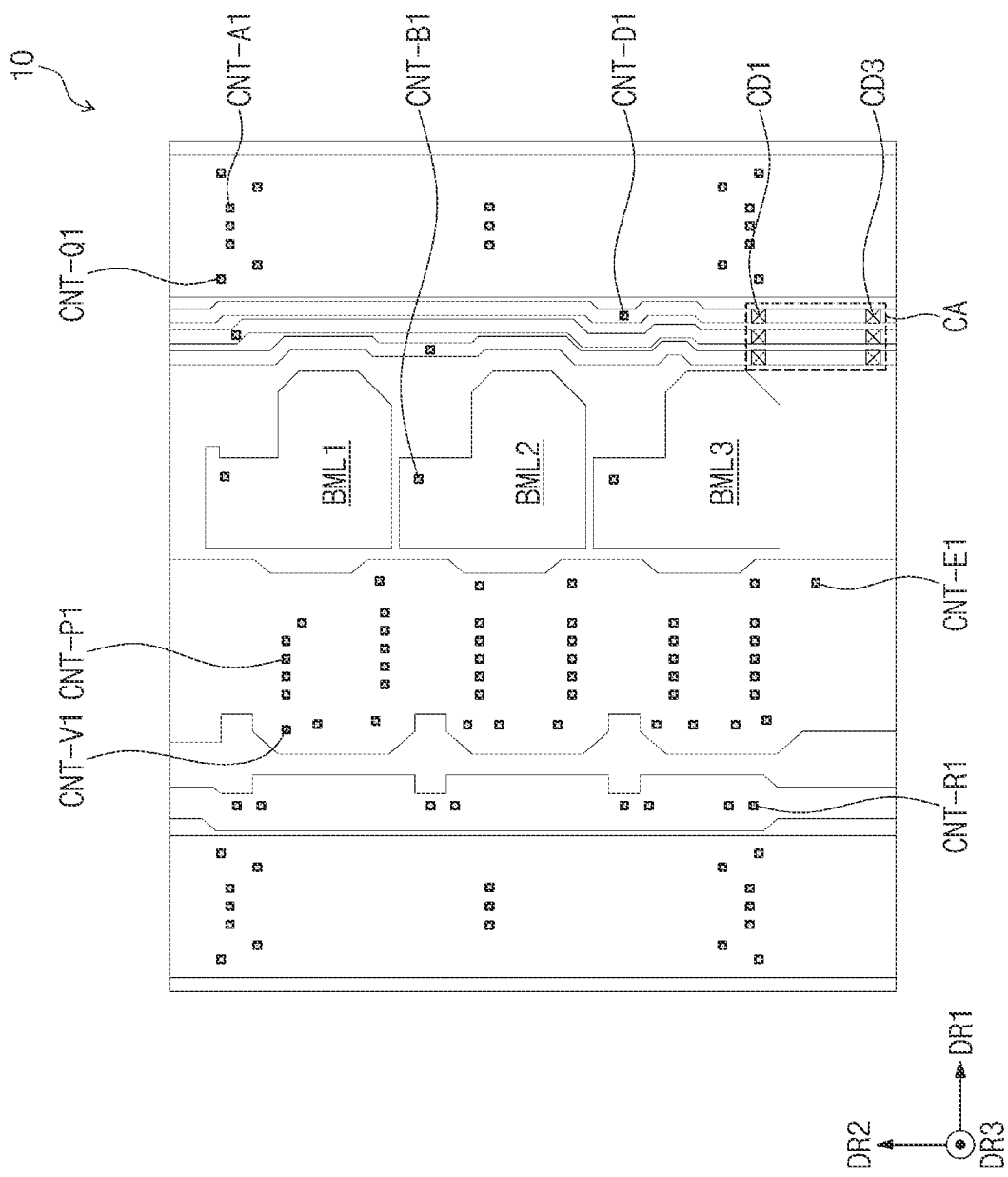

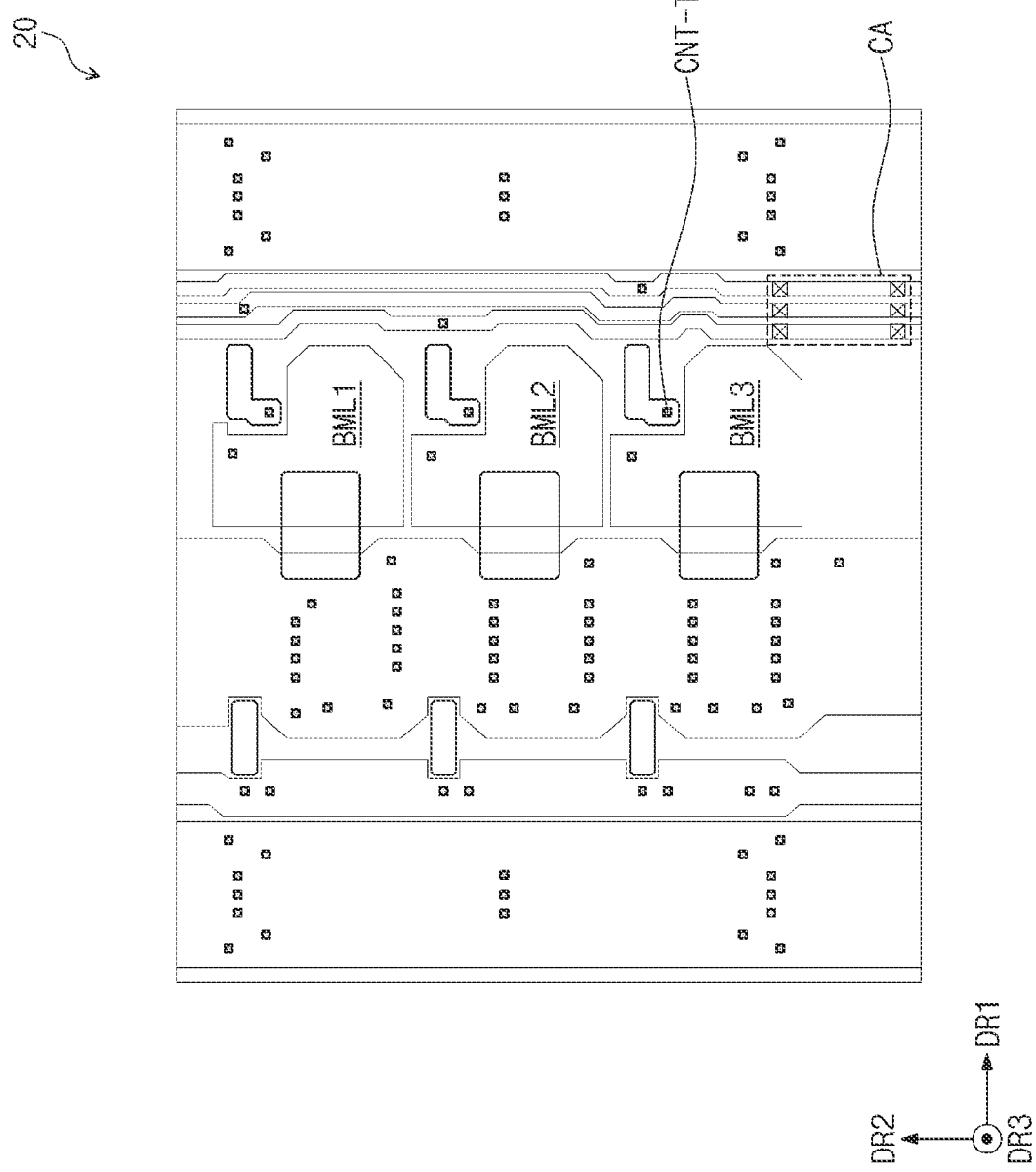

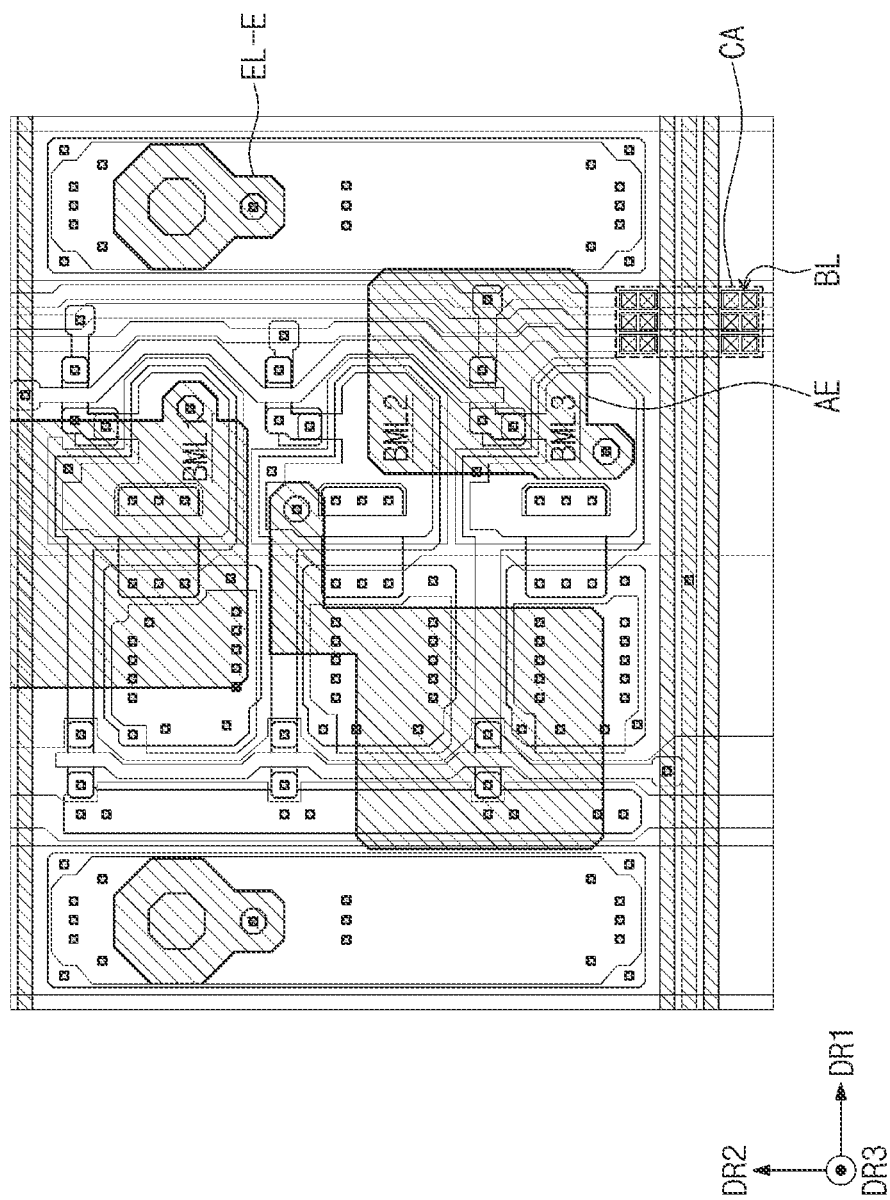

DISPLAY PANEL

CROSS-REFERENCE TO RELATED APPLICATION(S)

This application claims priority to and benefits of Korean Patent Application No. 10-2021-0157188 under 35 U.S.C. § 119, filed on Nov. 16, 2021 in the Korean Intellectual Property Office, the entire contents of which are incorporated herein by reference.

BACKGROUND

1. Technical Field

The disclosure herein relates to a display panel, and, to a display panel including a circuit element having improved reliability.

2. Description of the Related Art

A display panel may include pixels and a driving circuit (e.g., a scan driving circuit and a data driving circuit) controlling the pixels. Each of the pixels may include a display element and a driving circuit of the pixel, which controls the display element. The driving circuit of the pixel may include organically connected transistors.

The scan driving circuit and/or the data driving circuit may be formed through a same process as the process of forming the pixels. The scan driving circuit and/or the data driving circuit may include organically connected transistors.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a display panel having improved display quality.

An embodiment provides a display panel including a base layer; pixels including transistors, each of the transistors may include a semiconductor pattern and a gate; and light emitting elements electrically connected to the transistors; data lines electrically connected to corresponding pixels, spaced apart from each other in a first direction, and extending in a second direction intersecting the first direction; bridge lines electrically connected to the data lines; and scan lines and sensing lines electrically connected to the pixels, spaced apart from each other in the second direction, and extending in the first direction, wherein the bridge lines extend in the second direction and overlap the data lines in a plan view in an area in which the scan lines and the sensing lines intersect the data lines.

In an embodiment, each of the bridge lines may include a gate bridge having an end and another end, opposite to the end with the scan lines and the sensing lines disposed between the end and the another end in the second direction; a first source bridge overlapping the data line adjacent to the end and the gate bridge adjacent to the end in a plan view and electrically connected to the data line and the gate bridge; and a second source bridge overlapping the data line adjacent to the another end and the gate bridge adjacent to the another end in a plan view and electrically connected to the data line and the gate bridge.

In an embodiment, the gate bridge and the gate may include a same material.

In an embodiment, the first source bridge, the second source bridge, and the scan lines may include a same material.

In an embodiment, the first source bridge and the second source bridge may be spaced apart from each other with the scan lines and the sensing lines disposed between the first source bridge and the second source bridge in the second direction.

In an embodiment, each of the bridge lines may have an end and another end, with the scan lines and the sensing lines disposed between the end and the another end in the second direction, and each of the bridge lines may be directly electrically connected to a portion of the data lines, adjacent to the end, and a portion of the data lines, adjacent to the another end.

In an embodiment, each of the bridge lines and the gate may include a same material.

In an embodiment, each of the scan lines and the sensing lines and the gate may include a same material, and each of the bridge lines may include a material different from that of the gate.

In an embodiment, the display panel may further include insulating layers disposed on the base layer, wherein the insulating layers may include a first insulating layer disposed on the base layer to cover the data lines; a second insulating layer disposed on the first insulating layer to cover the semiconductor pattern; a third insulating layer disposed on the second insulating layer; and a fourth insulating layer disposed on the third insulating layer to cover the scan lines and the sensing lines.

In an embodiment, each of the bridge lines may include a gate bridge that overlaps the data line in a plan view disposed on the second insulating layer and covered by the third insulating layer; and a source bridge disposed on the third insulating layer and covered by the fourth insulating layer, wherein a portion of the source bridge, overlapping the gate bridge in a plan view, may be electrically connected to the gate bridge through a contact hole in the third insulating layer, and a portion of the source bridge, overlapping the data line in a plan view, may be electrically connected to the data line through contact holes in the third insulating layer and the first insulating layer.

In an embodiment, the bridge lines may overlap the data lines in a plan view, be disposed on the second insulating layer and may be covered by the third insulating layer, and may be directly electrically connected to the data line through contact holes in the first insulating layer and the second insulating layer with the scan lines and the sensing lines disposed between the first insulating layer and the second insulating layer.

In an embodiment, the transistors may include a first transistor, a second transistor, and a third transistor, and the display panel may include a light blocking pattern disposed on the base layer, covered by the first insulating layer, and overlapping at least a portion of a semiconductor pattern of the first transistor in a plan view.

In an embodiment, the display panel may further include a capacitor comprising a first pattern disposed on the second insulating layer and a second pattern, a first sub pattern disposed on the fourth insulating layer and electrically connecting a corresponding data line of the data lines and the second transistor, and a second sub pattern disposed on the fourth insulating layer and electrically connecting the second transistor and the first pattern of the capacitor.

In an embodiment, a portion of the second insulating layer may have a shape corresponding to a shape of the gate bridge on a plane.

In an embodiment, the display panel may further include insulating layers disposed on the base layer, wherein the insulating layers may include a first insulating layer disposed on the base layer and covering the data lines; a second insulating layer disposed on the first insulating layer and covering the semiconductor pattern; a third insulating layer disposed on the second insulating layer and covering the gate, the scan lines, and the sensing lines; and a fourth insulating layer disposed on the third insulating layer and covering the bridge lines, the bridge lines may be directly electrically connected to the data line through contact holes in the first insulating layer and the third insulating layer.

In an embodiment, a display panel may include a first transistor, a second transistor, and a third transistor, each of the first transistor, the second transistor, and the third transistor may include a semiconductor pattern and a gate; a light emitting element electrically connected to the first transistor; a scan line electrically connected to the second transistor and extending in a first direction; a sensing line electrically connected to the third transistor and extending in the first direction, the sensing line spaced apart from the scan line in a second direction intersecting the first direction; a data line electrically connected to the second transistor and extending in the second direction intersecting the first direction; and a bridge line electrically connected to the data line, wherein an area in which the data line intersects the scan line and the sensing line overlaps in a plan view an area in which the bridge line intersects the scan line and the sensing line.

In an embodiment, the bridge line may include a gate bridge having an end and another end, opposite to the end with the scan line and the sensing line disposed therebetween in the second direction; a first source bridge that overlaps in a plan view a portion of the data line adjacent to the end and the gate bridge adjacent to the end and electrically connected to a portion of the data line and the gate bridge; and a second source bridge that overlaps in a plan view another portion of the data line adjacent to the another end and the gate bridge adjacent to the another end and electrically connected to the another portion of the data line and the gate bridge.

In an embodiment, the gate bridge and the gate may be disposed on a same layer.

In an embodiment, the first source bridge, the second source bridge, and the scan line may be disposed on a same layer.

In an embodiment, the first bridge line may have an end and another end, with the scan line and the sensing line disposed between the end and the another end in the second direction, and the bridge line may be directly electrically connected to a portion of the data line, adjacent to the end, and a portion of the data line, adjacent to the another end.

In an embodiment, the bridge line and the gate may be disposed on a same layer.

In an embodiment, the scan line, the sensing line, and the gate may be disposed on a same layer, and the bridge line and the gate may be disposed on a different layer.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain principles of the disclosure. In the drawings:

FIGS. 6A to 6K are schematic plan views in which the lamination order of the conductive patterns provided in the unit pixel is divided for each layer according to an embodiment;

and

Figure 11A:
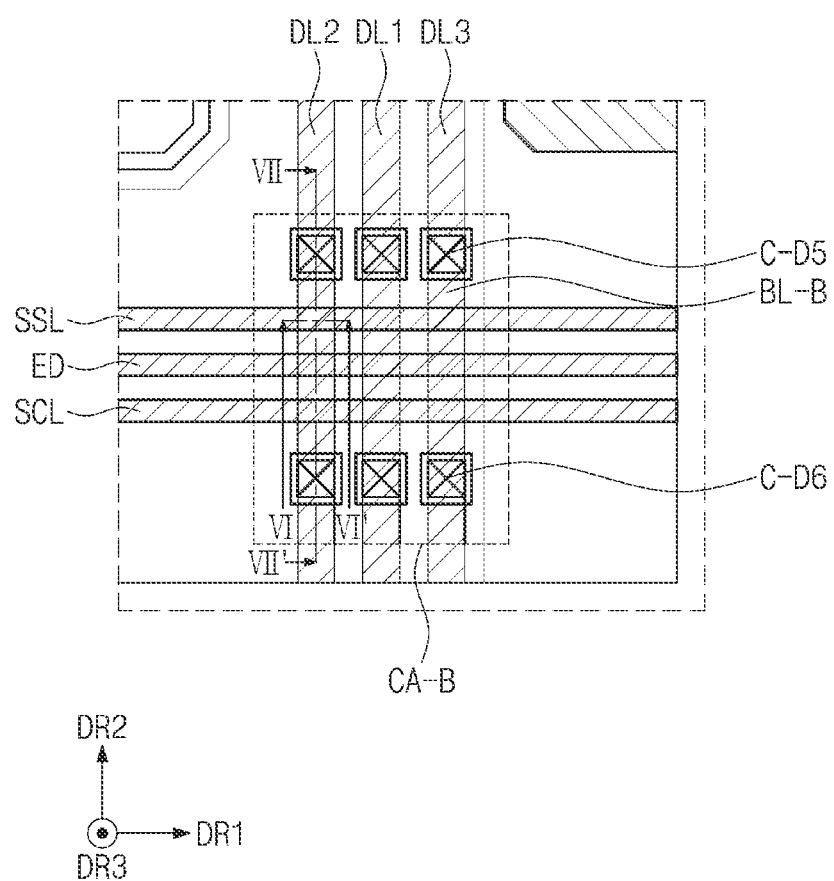
FIG. 11A is an enlarged schematic plan view illustrating one area of the unit pixel according to an embodiment.
Figure 11B:
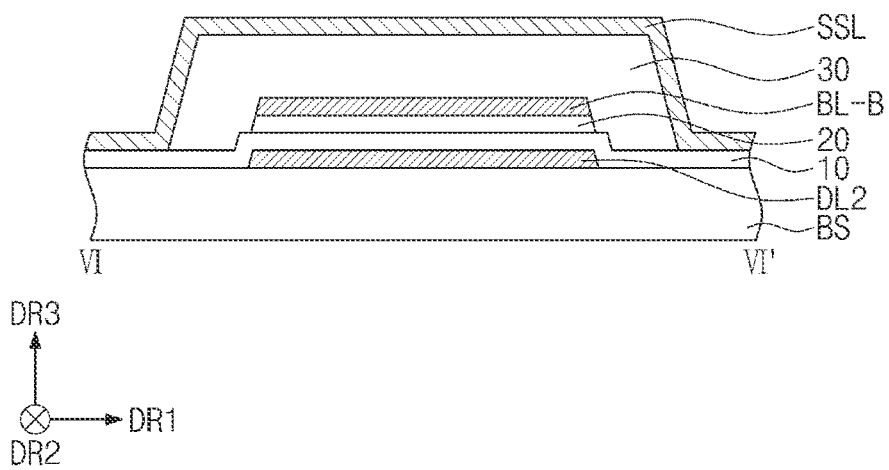
FIG. 11B is a schematic cross-sectional view taken along line VI-VI' of FIG. 11A.
Figure 11C:
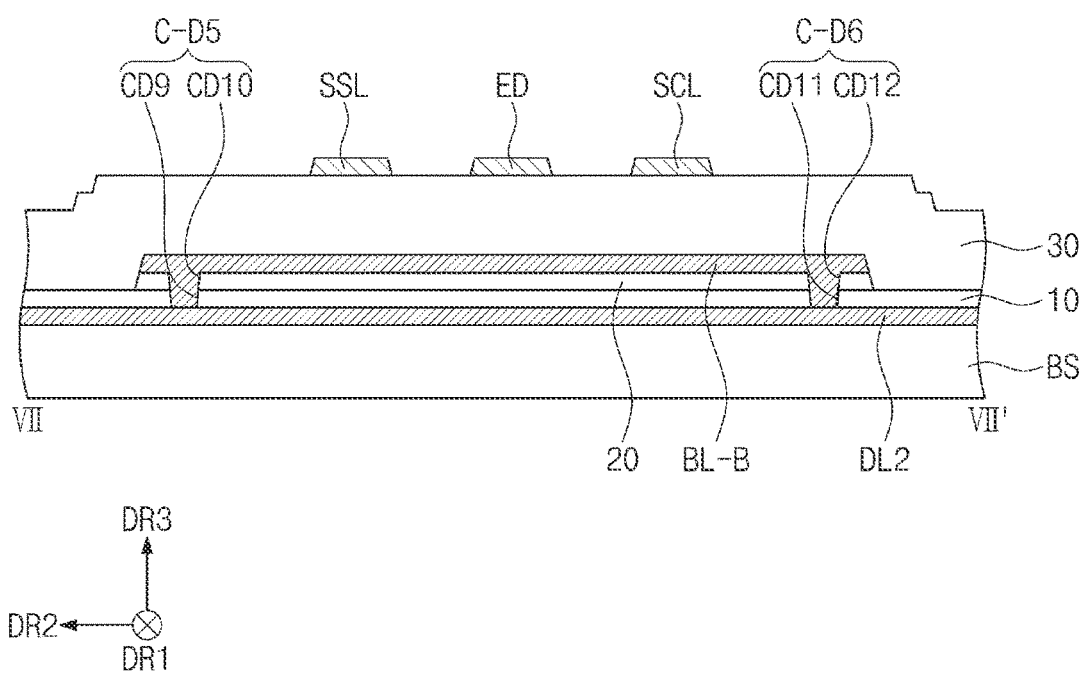

FIG. 11C is a schematic cross-sectional view taken along line VII-VII' of FIG. 11A.

DETAILED DESCRIPTION OF THE EMBODIMENTS

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In this specification, it will also be understood that when one component (or region, layer, portion) is referred to as being 'on', 'connected to', or 'coupled to' another component, it can be directly disposed/connected/coupled on/to the one component, or an intervening third component or other components may also be present.

It will be understood that the terms "connected to" or "coupled to" may include a physical or electrical connection or coupling.

Like reference numerals refer to like elements throughout. Also, in the figures, the thickness, ratio, and dimensions of components may be exaggerated for clarity of illustration.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

It will be understood that although the terms such as 'first' and 'second' are used herein to describe various elements, these elements should not be limited by these terms. The terms are only used to distinguish one component from other components. For example, a first element referred to as a first element in an embodiment can be referred to as a second element in another embodiment without departing from the scope of the appended claims. The terms of a singular form may include plural forms unless referred to the contrary.

Also, ""under", "below", "above', "upper", and the like are used for explaining relation association of the elements illustrated in the drawings. The terms may be a relative concept and described based on directions expressed in the drawings.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments will be described with reference to the accompanying drawings.

Figure 1A:
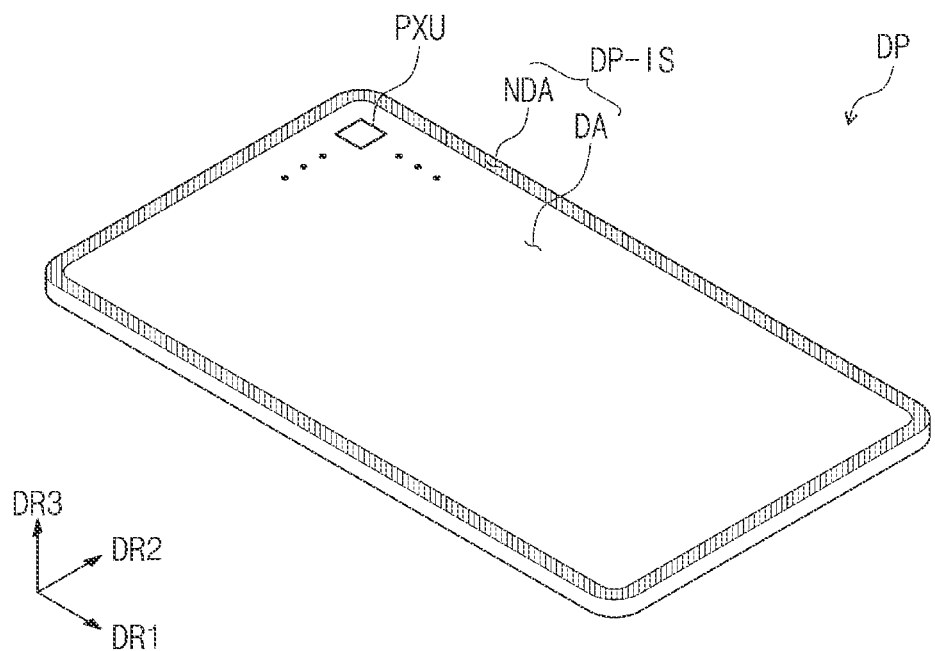
FIG. 1A is a schematic perspective view of a display panel according to an embodiment.
Figure 1B:
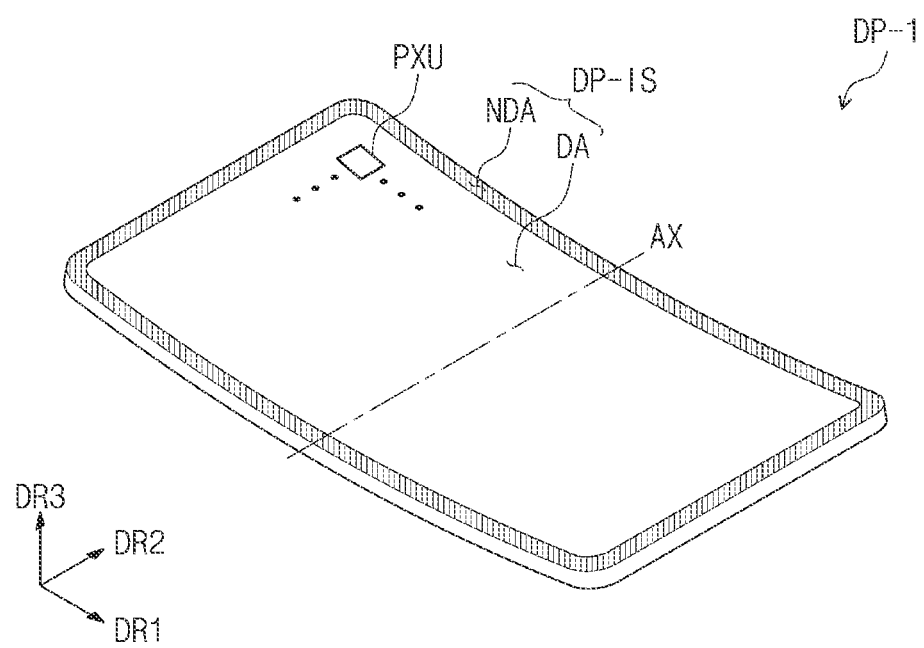
FIG. 1B is a schematic perspective view of a curved display panel according to an embodiment.
Figure 2:
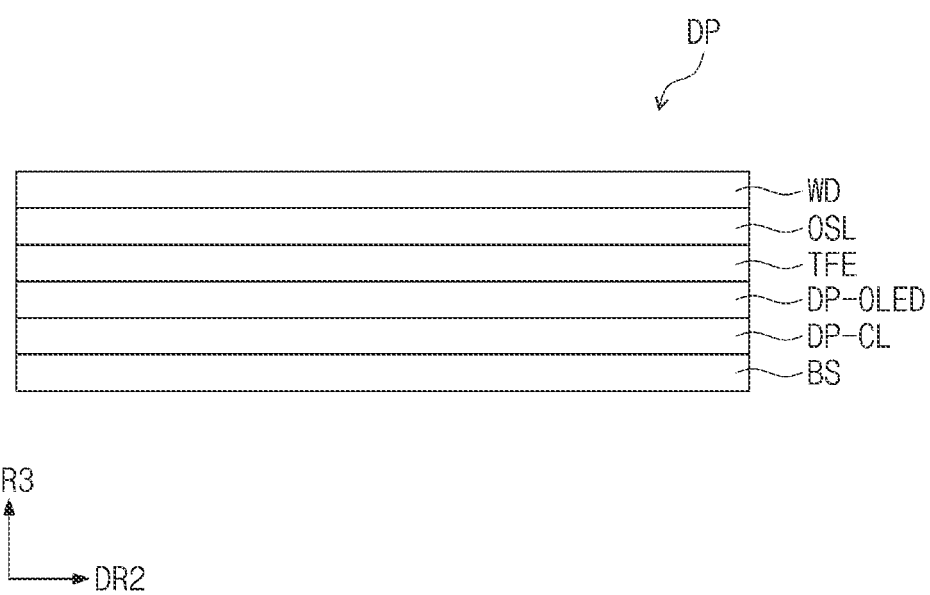
FIG. 2 is a schematic cross-sectional view of the display panel according to an embodiment.
Figure 3:
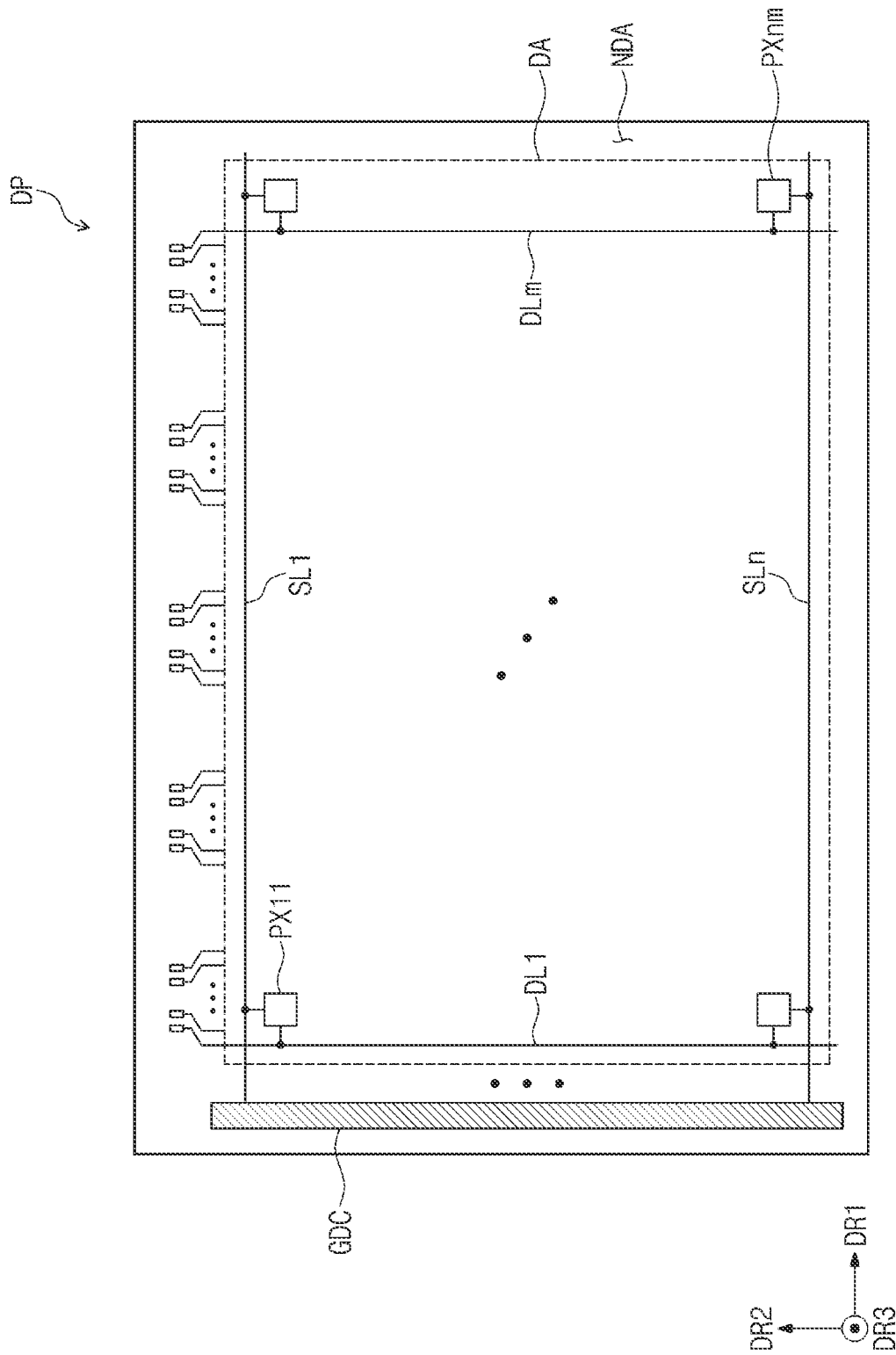
FIG. 3 is a schematic plan view of a display panel according to an embodiment.
Figure 4:
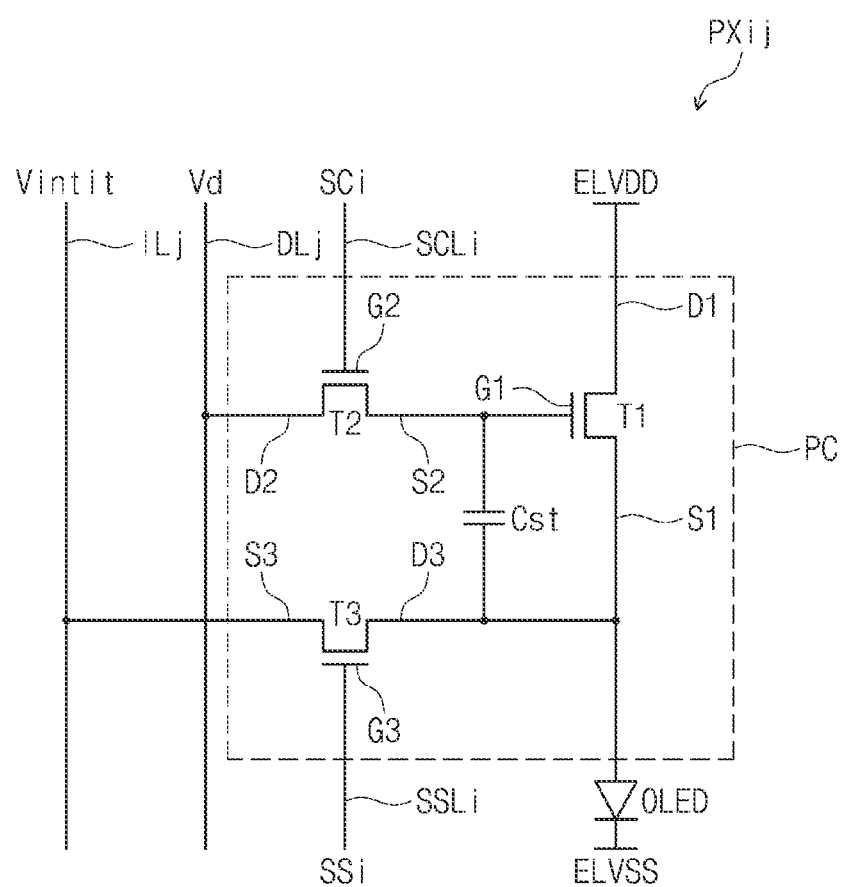
FIG. 4 is a schematic diagram of an equivalent circuit of a pixel according to an embodiment.

FIG. 1A is a schematic perspective view of a display panel according to an embodiment; FIG. 1B is a schematic perspective view of a curved display panel according to an embodiment. FIG. 2 is a schematic cross-sectional view of the display panel according to an embodiment. FIG. 3 is a schematic plan view of a display panel according to an embodiment. FIG. 4 is a schematic diagram of an equivalent circuit of a pixel according to an embodiment;

Each of display panels DP and DP-1 illustrated in FIGS. 1A and 1B may be an emissive display panel and include one of a liquid crystal display panel, an electrophoretic display panel, a microelectromechanical system (MEMS) display panel, an electrowetting display panel, an organic light emitting display panel, an inorganic light emitting display panel, and a quantum-dot display panel. Each of the display panels DP and DP-1 according to an embodiment may include a subminiature light emitting element. For example, each of the display panels DP and DP-1 may include a micro LED element and/or a nano LED element, but is not particularly limited.

As illustrated in FIG. 1A, the display panel DP may display an image through a display surface DP-IS. A top surface of a member disposed at the uppermost side of the display panel DP may be defined as the display surface DP-IS. According to the disclosure, a top surface of a window panel WD illustrated in FIG. 2 may be provided as a display surface DP-IS of the display panel DP.

The display surface DP-IS may be a surface that is parallel a surface defined by a first direction DR1 and a second direction DR2. A normal direction of the display surface DP-IS, for example, a thickness direction of the display panel DP is indicated as a third direction DR3. A front surface (or a top surface) and a rear surface (or a bottom surface) of each of layers or units, which will be described below, are distinguished by the third direction DR3.

The display panel DP may include a display area DA and a non-display area NDA. An emission layer EML of a pixel PX (see FIG. 7) is disposed on the display area DA, and the emission layer EML of the pixel PX is not disposed on the non-display area NDA. The non-display area NDA is defined along an edge of the display surface DP-IS. The non-display area NDA may surround or may be adjacent to the display area DA. In an embodiment, the non-display area NDA may be omitted or may be disposed at only one side or a side of the display area DA.

Referring to FIG. 1B, the display panel DP-1 according to an embodiment may be curved along the first direction DR1 with respect to a virtual axis AX extending in the second direction DR2. However, the embodiment is not limited thereto, and the axis may extend in the first direction DR1 or may be curved based on axes extending in different directions.

Each of the display panels DP and DP-1 according to an embodiment may be a rollable display panel, a foldable display panel, or a slidable display panel. Here, each of the display panels DP and DP-1 may have a flexible property and may be folded or rolled after being installed in the display device. Thus, each of the display panels DP and DP-1 may include a curved display surface or a three-dimensional display surface DP-IS. The solid display surface DP-IS may include display areas that indicate different directions.

FIGS. 1A and 1B illustrate a state in which a unit pixel PXU is disposed on the display area DA. The unit pixel PXU may include at least two pixels providing different light. For example, the unit pixel PXU may be an area on which pixels providing green, red, and blue light are disposed. An emission area, shape, and arrangement of each of the pixels provided in the unit pixel PXU are not limited to any one shape and/or arrangement. For example, the emission area of each of the pixels provided in the unit pixel PXU may be different from each other. Each of the emission areas may have a circular or polygonal shape on the plane.

Referring to FIG. 2, the display panel DP according to the i disclosure may include a base layer BS, a circuit element layer DP-CL disposed on the base layer BS, a display element layer DP-OLED, a thin film encapsulation layer TFE, a light control layer OSL, and a window panel WD. The display panel DP may further include functional layers such as an anti-reflection layer, a refractive index control layer, and the like within the spirit and the scope of the disclosure. The circuit element layer DP-CL may include at least insulating layers and a circuit element. The insulating layers described below may include an organic layer and/or an inorganic layer.

A base layer BS may include a synthetic resin layer. The synthetic resin layer may include a thermosetting resin. For example, the synthetic resin layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyamide-based resin, or a perylene-based resin. The synthetic resin layer may include a glass substrate, a metal substrate, or an organic/inorganic composite substrate.

The circuit element layer DP-CL forms an insulating layer, a semiconductor layer, and a conductive layer through processes such as coating and deposition. Thereafter, the insulating layer, the semiconductor layer, and the conductive layer may be selectively patterned through photolithography and etching processes. A semiconductor pattern, a conductive pattern, a signal line, and the like are formed through the process. The patterns disposed on a same layer are formed through a same process by using the same materials.

The circuit element layer DP-CL may include a driving circuit or a signal line, which constitutes the pixel PX. The display element layer DP-OLED may include a light emitting element OLED (see FIG. 7) and a pixel defining layer PDL (see FIG. 7), which are provided in the pixel PX.

The thin film encapsulation layer TFE may be disposed on the display element layer DP-OLED to protect the light emitting element OLED. The thin film encapsulation layer TEF may include inorganic layers and an organic layer disposed between the inorganic layers. The inorganic layers may protect the light emitting element OLED against moisture and oxygen, and the organic layer may protect the light emitting element OLED against foreign substances such as dust particles.

A light control layer OSL may include light control patterns that change optical properties of a source light generated in the light emitting element OLED. The light control patterns may include quantum dots and also include color filter patterns that selectively transmit light passing through the light control patterns.

The window panel WD may be disposed on the display panel DP and may transmit an image provided from the display panel DP to the outside. The window panel WD may be divided into the display area DA and the non-display area NDA of the display surface DP-IS as illustrated in FIG. 1A. A boundary between the display area DA and the non-display area NDA may be defined by a bezel pattern disposed under or below the window panel WD and absorbing light.

The window panel WD may include a base layer and functional layers disposed on the base layer. The functional layers may include a protective layer, an anti-fingerprint layer, and the like within the spirit and the scope of the disclosure. The base layer of the window panel WD may be made of glass, sapphire, or plastic.

FIG. 3 illustrates an arrangement relationship between signal lines SL1 to SLn and DL1 to DLm and pixels PX11 to PXnm, which are provided in the display panel DP, on the plane. The signal lines SL1 to SLn and DL1 to DLm may include scan lines SL1 to SLn and data lines DL1 to DLm.

The pixels PX11 to PXnm may be disposed on the display area DA. Each of the pixels PX11 to PXnm is connected to a corresponding scan line of the scan lines SL1 to SLn and a corresponding data line of the data lines DL1 to DLm. Each of the pixels PX11 to PXnm may include a pixel driving circuit and a light emitting element. More kinds of signal lines may be provided on the display panel DP according to a configuration of the pixel driving circuit of the pixels PX11 to PXnm. It is to be understood that pixels PX11 to PXnm may include pixels PX: PX1, PX2, and PX3.

A gate driver circuit GDC may be disposed on the non-display area NDA. The gate driver circuit GDC may be integral with the display panel DP through an oxide silicon gate driver circuit (OSG) process or an amorphous silicon gate driver circuit (ASG) process.

FIG. 4 illustrates a circuit diagram of one pixel PXij among the pixels PX11 to PXnm.

The pixel PXij may include a pixel circuit PC and a light emitting element OLED. The pixel circuit PC may include transistors T1 to T3 and a capacitor Cst.

The transistors T1 to T3 may be formed through a low-temperature polycrystalline silicon (LTPS) process or a low-temperature polycrystalline oxide (LTPO) process. Each of the first to third transistors T1 to T3 may include any one of a silicon semiconductor and an oxide semiconductor. Here, the oxide semiconductor may include a crystalline or amorphous oxide semiconductor, and the silicon semiconductor may include amorphous silicon, polycrystalline silicon, and the like, but is not limited to any one embodiment.

Hereinafter, each of the first to third transistors T1 to T3 is described as an N-type, but is not limited thereto. For example, each of the first to third transistors T1 to T3 may be a P-type transistor or an N-type transistor according to an applied signal. Here, a source and drain of the P-type transistor may correspond to a drain and source of the N-type transistor, respectively.

FIG. 4 illustrates an example of the pixel PXij connected to an i-th scan line SCLi, an i-th sensing line SSLi, a j-th data line DLj, and a j-th initial line ILj.

The pixel circuit PC may include a first transistor T1 (driving transistor), a second transistor T2 (switch transistor), a third transistor T3 (sensing transistor), and a capacitor Cst. However, the pixel circuit PC may further include an additional transistor and an additional capacitor, but is not limited to any one embodiment.

The light emitting element OLED may be an organic light emitting element or inorganic light emitting element including an anode (first electrode) and a cathode (second electrode). The anode of the light emitting element OLED may receive a first voltage ELVDD through the first transistor T1, and the cathode of the light emitting element OLED may receive a second voltage ELVSS. The light emitting element OLED may receive the first voltage ELVDD and the second voltage ELVSS to emit light.

The first transistor T1 may include a drain D1 receiving the first voltage ELVDD, a source S1 connected to the anode of the light emitting element OLED, and a gate G1 connected to the capacitor Cst. The first transistor T1 may control driving current flowing through the light emitting element OLED at the first voltage ELVDD in response to a voltage value stored in the capacitor Cst.

The second transistor T2 may include a drain D2 connected to the j-th data line DLj, a source S2 connected to the capacitor Cst, and a gate G2 receiving an i-th first scan signal SCi. The second transistor T2 provides a data voltage Vd to the first transistor T1 in response to the i-th first scan signal SCi.

The third transistor T3 may include a source S3 connected to the j-th initial line ILj, a drain D3 connected to the anode of the light emitting element OLED, and a gate G3 receiving the i-th second scan signal SSi. The j-th initial line ILj may receive an initial voltage Vintit.

The capacitor Cst may store voltage differences having various values according to an input signal. For example, the capacitor Cst may store a voltage corresponding to a difference between a voltage transmitted from the second transistor T2 and the first voltage ELVDD.

Figure 5:
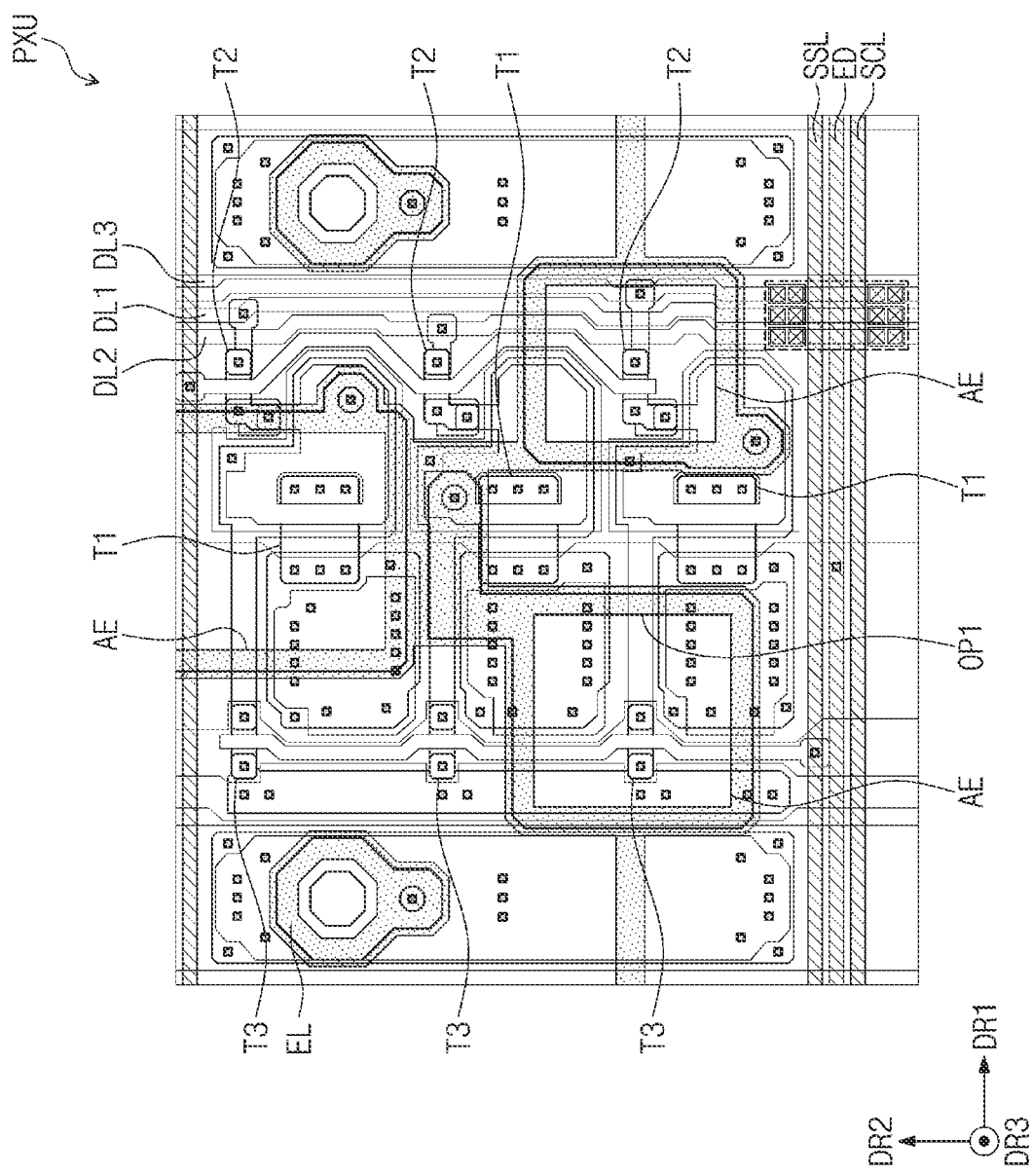
FIG. 5 is a schematic plan view illustrating a lamination order of conductive patterns provided in a unit pixel according to an embodiment.
Figure 7:
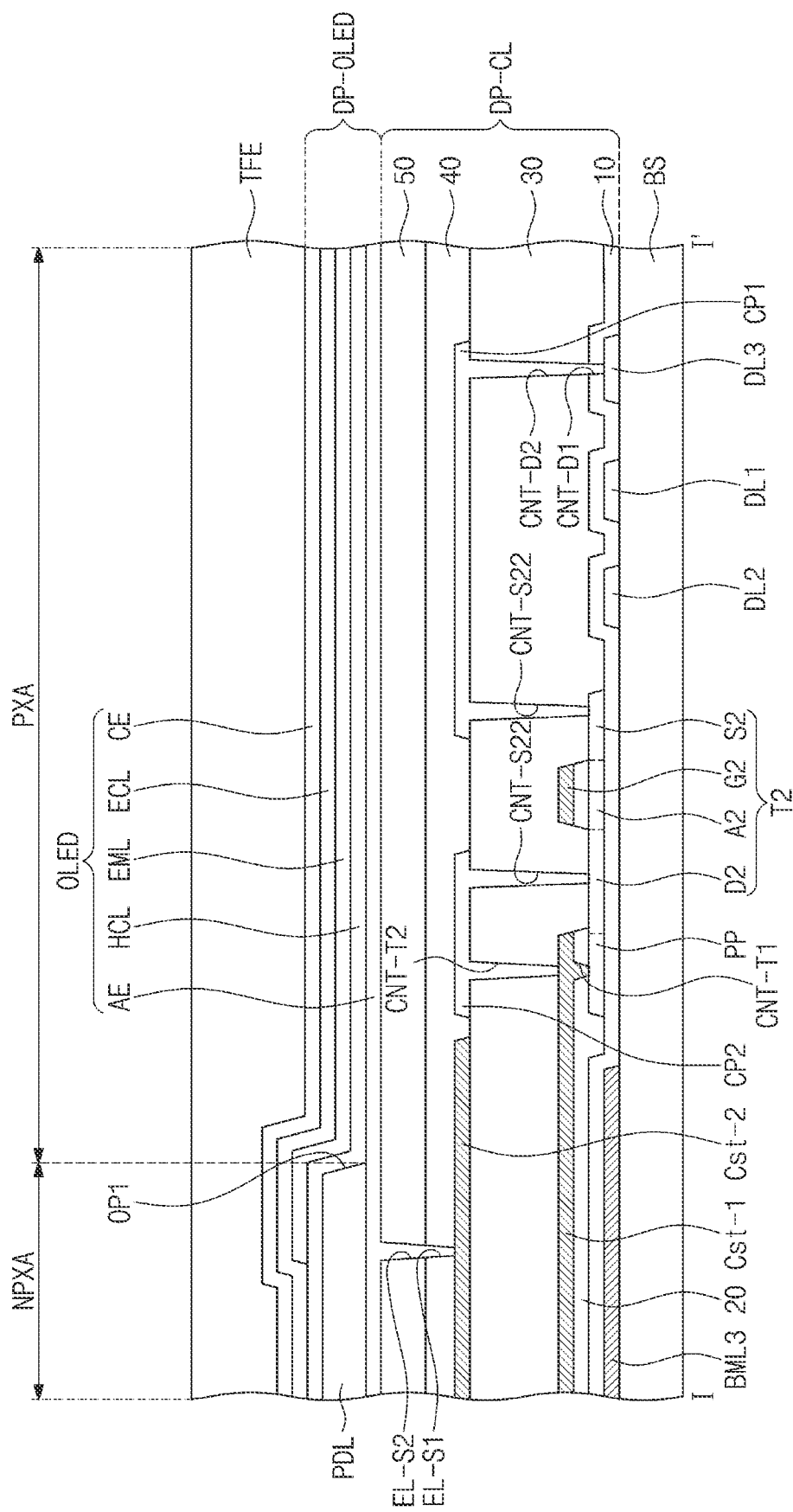
FIG. 7 is a schematic cross-sectional view taken along line I-I' of FIG. 6K.
Figure 8:
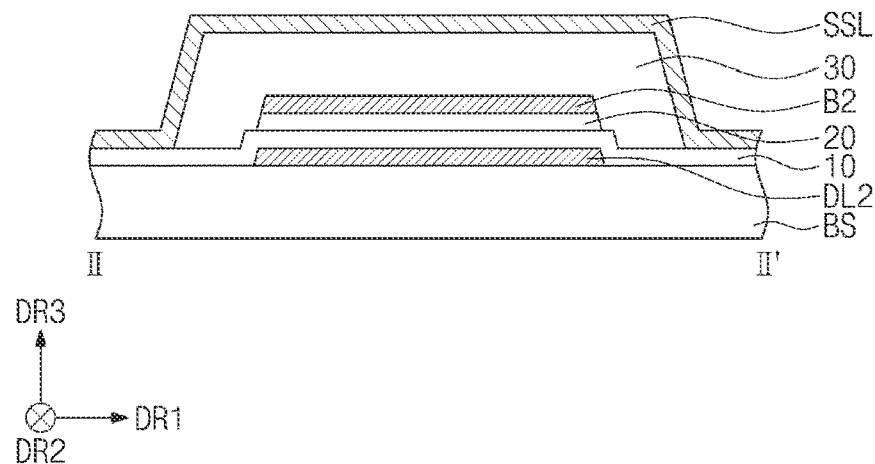
FIG. 8 is a schematic cross-sectional view taken along line II-II' of FIG. 6K.
Figure 9:
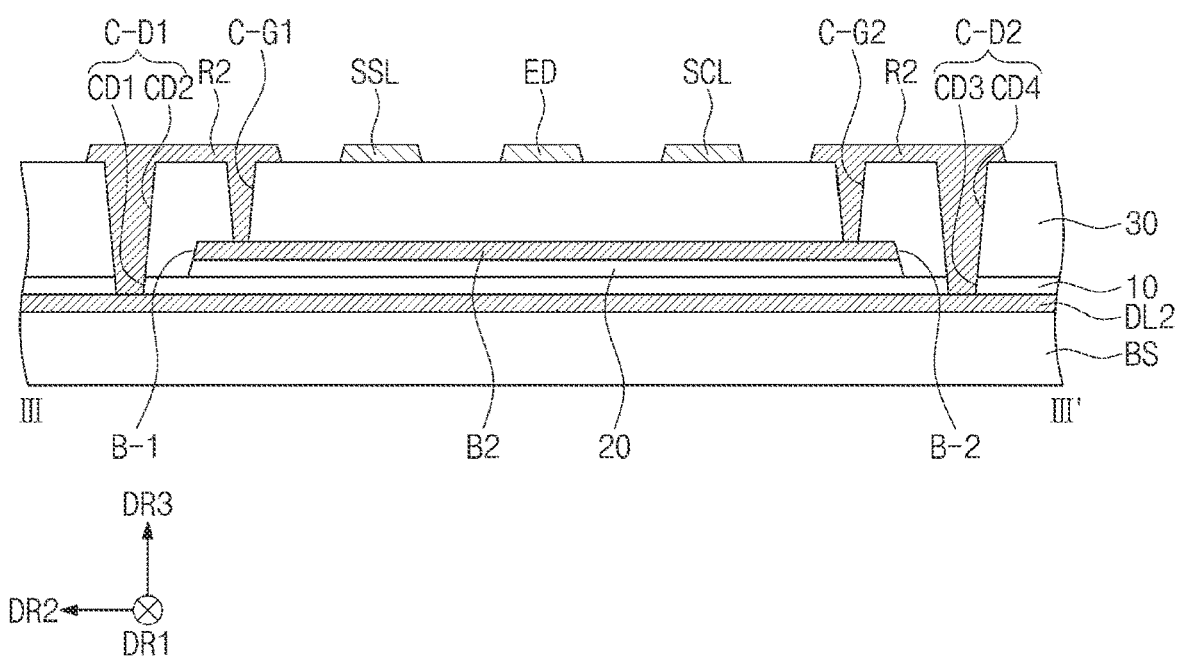
FIG. 9 is a schematic cross-sectional view taken along line of III-III' FIG. 6K.

FIG. 5 is a schematic plan view illustrating a lamination order of conductive patterns provided in the unit pixel according to an embodiment. FIGS. 6A to 6K are schematic plan views in which the lamination order of the conductive patterns provided in the unit pixel is divided for each layer according to an embodiment. FIG. 7 is a schematic cross-sectional view taken along line I-I' of FIG. 6K. FIG. 8 is a schematic cross-sectional view taken along line II-II' of FIG. 6K. FIG. 9 is a schematic cross-sectional view taken along line III-III' of FIG. 6K.

FIG. 5 illustrates an arrangement relationship between three pixels provided in the unit pixel PXU (see FIG. 1A) and components provided in the driving element, and FIGS. 6A to 6K illustrate the components of FIG. 5, which are divided for each layer.

Each of the pixels is connected to a first power line ED, a second power line EL, a scan line SCL, and a sensing line SSL. Also, the pixels may be connected to the corresponding data lines DL1, DL2, and DL3. The first power line ED may provide the first voltage ELVDD, and the second power line EL may provide the second voltage ELVSS (see FIG. 4) that is lower than the first voltage ELVDD.

Each of the pixels may include the first to third transistors T1, T2, and T3, the capacitor Cst, and the light emitting element OLED (see FIG. 4). FIG. 5 illustrates the first electrode AE of the light emitting element OLED provided in each of pixels PX1, PX2, and PX3.

An equivalent circuit diagram relating to the first to third transistors T1, T2, and T3 and the capacitor Cst, which are provided in one of the pixels, may correspond to that described in FIG. 4.

In the components illustrated in FIGS. 6A to 6K, reference numerals for components disposed on different layers are described only for each layer, and omitted reference numerals will be described with reference to FIGS. 6A to 6K.

Figure 6A:
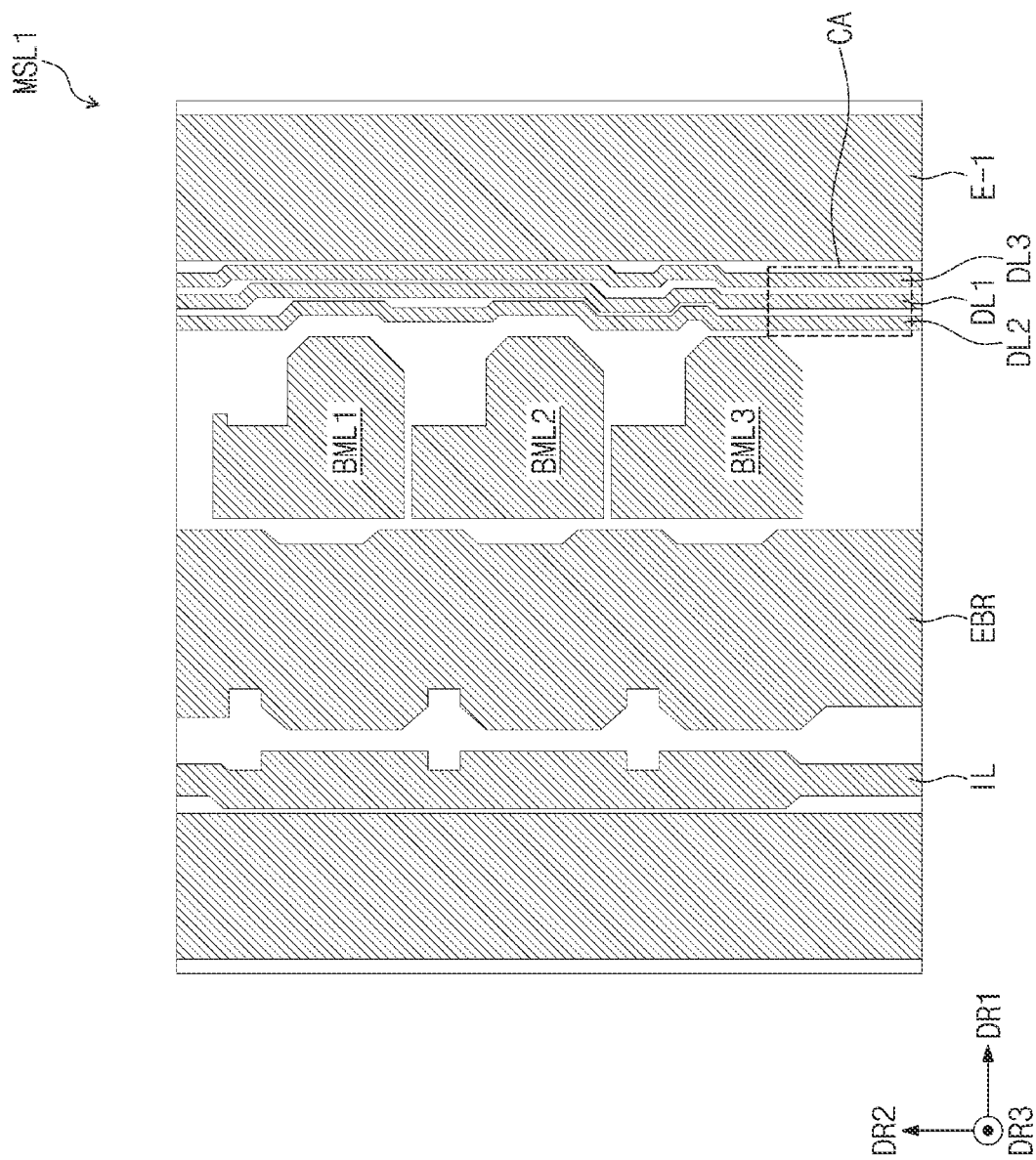

Referring to FIGS. 5 and 6A, a first conductive layer MSL1 may include an initial line IL, a power pattern EBR, light blocking patterns BML1, BML2, and BML3, first to third data lines DL1, DL2, and DL3, and a first line E-1 of the second power line EL.

In the disclosure, the first to third data lines DL1, DL2, and DL3 may be spaced apart from each other in the first direction DR1, and each of the first to third data lines DL1, DL2 and DL3 may extend in the second direction DR2. FIGS. 5 to 6K illustrate the second data line DL2, the first data line DL1, and the third data line DL3, which are sequentially arranged (or disposed) in the first direction DR1, but this embodiment is not limited thereto. An arrangement order of the first to third data lines DL1, DL2, and DL3 may be changed and is not limited to any one embodiment.

Each of the initial line IL and the power pattern EBR may extend along the second direction DR2, and the initial line IL and the power pattern EBR may be spaced apart from each other in the first direction DR1. The power pattern EBR may be connected to the first power line ED of a fourth conductive layer MSL4 to be described later and may provide the first voltage ELVDD to the first transistor T1.

The first line E-1, which is disposed at the lowermost layer, of the second power line EL may extend in the second direction DR2. Thus, the first line E-1 may extend in a same direction as the first to third data lines DL1, DL2, and DL3 and the initial line IL.

The light blocking patterns BML1, BML2, and BML3 may be disposed between the second data line DL2 and the power pattern EBR and may be spaced apart from each other in the second direction DR2. The light blocking patterns BML1, BML2, and BML3 may be individually provided to partially overlap the semiconductor layer of the first transistor T1 among the corresponding pixels. According to an embodiment, each of the light blocking patterns BML1, BML2, and BML3 may be connected to the source S1 of the overlapping first transistor T1 and receive a signal applied to the source S1 to form a sync structure below the semiconductor pattern.

According to the disclosure, an area on which the first to third data lines DL1, DL2, and DL3, the scan line SCL, the first power line ED, and the sensing line SSL overlap each other may be defined as a 'crossing area CA'. In the crossing area CA, each of the data lines DL1, DL2, and DL3 may be doubly connected through bridge lines BL to be described later.

The first conductive layer MSL1 may be covered (or overlapped) by the first insulating layer 10. The first insulating layer 10 may be a buffer layer.

FIG. 6B illustrates contact holes defined in the first insulating layer 10. The first insulating layer 10 may be disposed on the base layer BS (see FIG. 2) to cover the first conductive layer MSL1. The contact holes passing through the first insulating layer 10 and exposing a portion of the first conductive layer MSL1 may be defined in the first insulating layer 10.

First initial contact holes CNT-R1 may expose a portion of the initial line IL.

First-1 additional contact holes CNT-A1 and first-2 additional contact holes CNT-Q1 may expose a portion of the first line E-1.

First-1 power contact holes CNT-P1 and first-2 power contact holes CNT-V1 may expose a portion of the power pattern EBR.

First data contact holes CNT-D1 may expose a portion of the corresponding data line among the first to third data lines DL1, DL2, and DL3.

First light blocking contact holes CNT-B1 may expose a portion of the corresponding light blocking pattern among the light blocking patterns BML1, BML2, and BML3.

A first line contact hole CNT-E1 may expose a portion of the power pattern EBR.

A first hole CD1 and a third hole CD3 may expose one end or an end and the other end or another end of the corresponding data line among the first to third data lines DL1, DL2 and DL3. As shown 6F and 9, the first contact hole CD1 overlaps the second contact hole CD2 defined in the third insulating layer 30. The first contact hole CD1 and the second contact hole CD2 may be defined as "a first-1 bridge contact hole C-D1". And the third contact hole CD3 overlaps the fourth contact hole CD4 defined in the third insulating layer 30. The third contact hole CD3 and the fourth contact hole CD4 may be defined as "a first-2 bridge contact hole C-D2".

Figure 6C:
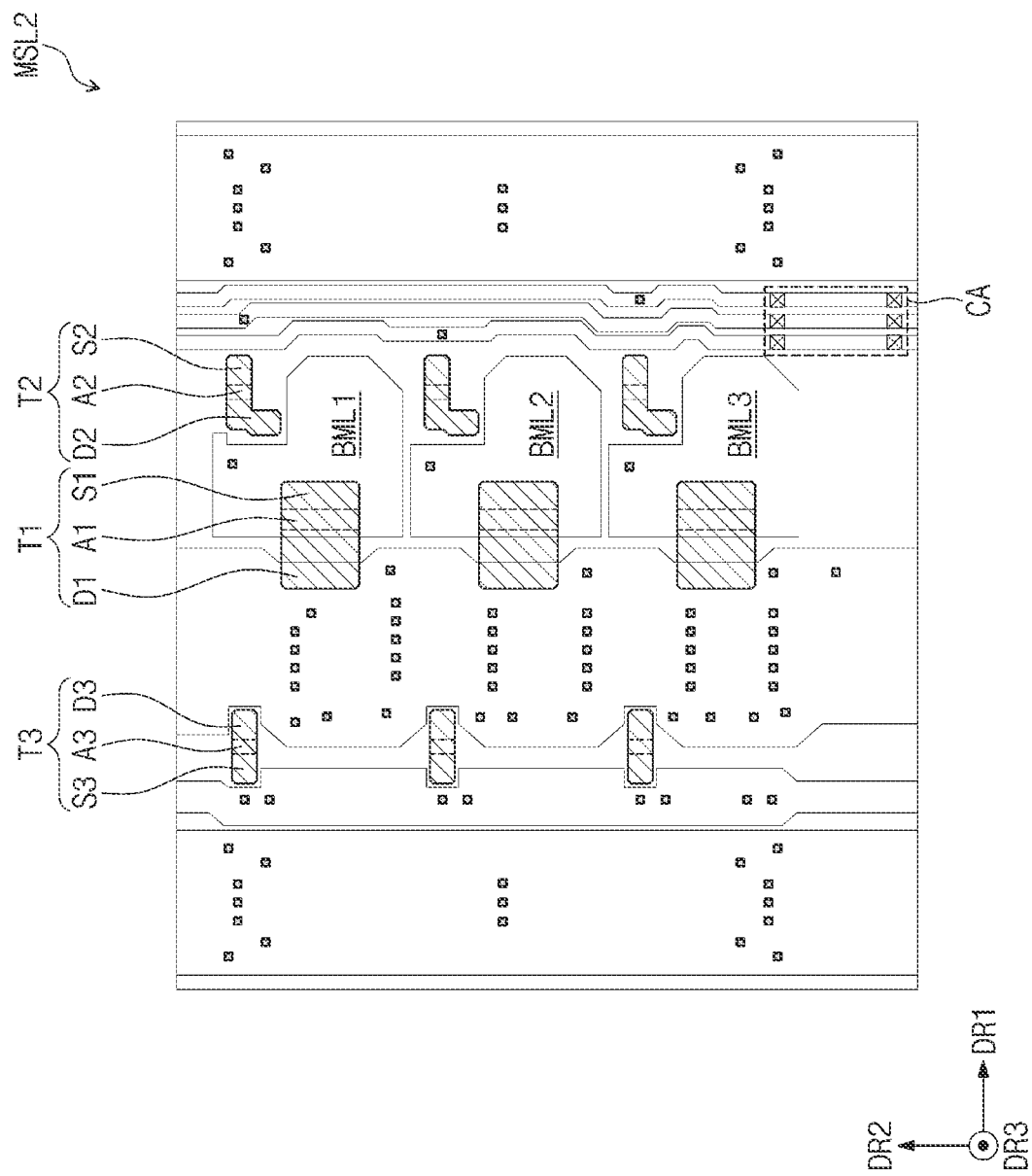

Referring to FIGS. 5 and 6C, the second conductive layer MSL2 according to the disclosure may be disposed on the first insulating layer 10. The second conductive layer MSL2 may include a semiconductor layer provided in each of the first to third transistors T1, T2, and T3.

A semiconductor pattern provided in the first transistor T1 may include a source S1, a drain D1, and a channel region A1. A channel region A1 may be disposed between the source S1 and the drain D1. A semiconductor pattern provided in the second transistor T2 may include a source S2, a drain D2, and a channel region A2. The channel region A2 may be disposed between the source S2 and the drain D2. A semiconductor pattern provided in the third transistor T3 may include a source S3, a drain D3, and a channel region A3. The channel region A3 may be disposed between the source S3 and the drain D3.

The regions provided in each of the semiconductor patterns may be divided into the source, the drain, and the channel region after a reduction process is performed using a gate to be described later as a mask Each of the semiconductor patterns may be provided as an oxide semiconductor pattern. For example, the oxide semiconductor may include any one of indium gallium zinc oxide (IGZO) and indium tin zinc oxide (ITZO). However, the disclosure is not limited thereto, and the semiconductor patterns may be made of amorphous silicon or polycrystalline silicon, but is not limited to any one embodiment.

FIG. 6D illustrates contact holes defined in the second insulating layer 20. The second insulating layer 20 is disposed on the first insulating layer 10 to cover a portion of the second conductive layer MSL2. Contact holes passing through the second insulating layer 20 to expose a portion of the second conductive layer MSL2 may be defined in the second insulating layer 20.

A first gate contact hole CNT-T1 may overlap a protrusion PP (see FIG. 7) protruding from the drain D2 provided in the second transistor T2.

According to the disclosure, the contact holes may be defined in the second insulating layer 20, and, the conductive layer disposed on the second insulating layer 20 may be patterned to form a third conductive layer MSL3. Thereafter, the second insulating layer 20 may be removed using the conductive patterns disposed on the third conductive layer MSL3 as a mask.

Thus, in the disclosure, a shape of the second insulating layer 20 on the plane may correspond to the shapes of the conductive patterns provided in the third conductive layer MSL3 except for the contact holes defined in the second insulating layer 20. In the disclosure, the meaning of 'corresponding to the shape' does not mean having a same area on the plane and may include an error in the process.

Figure 6E:
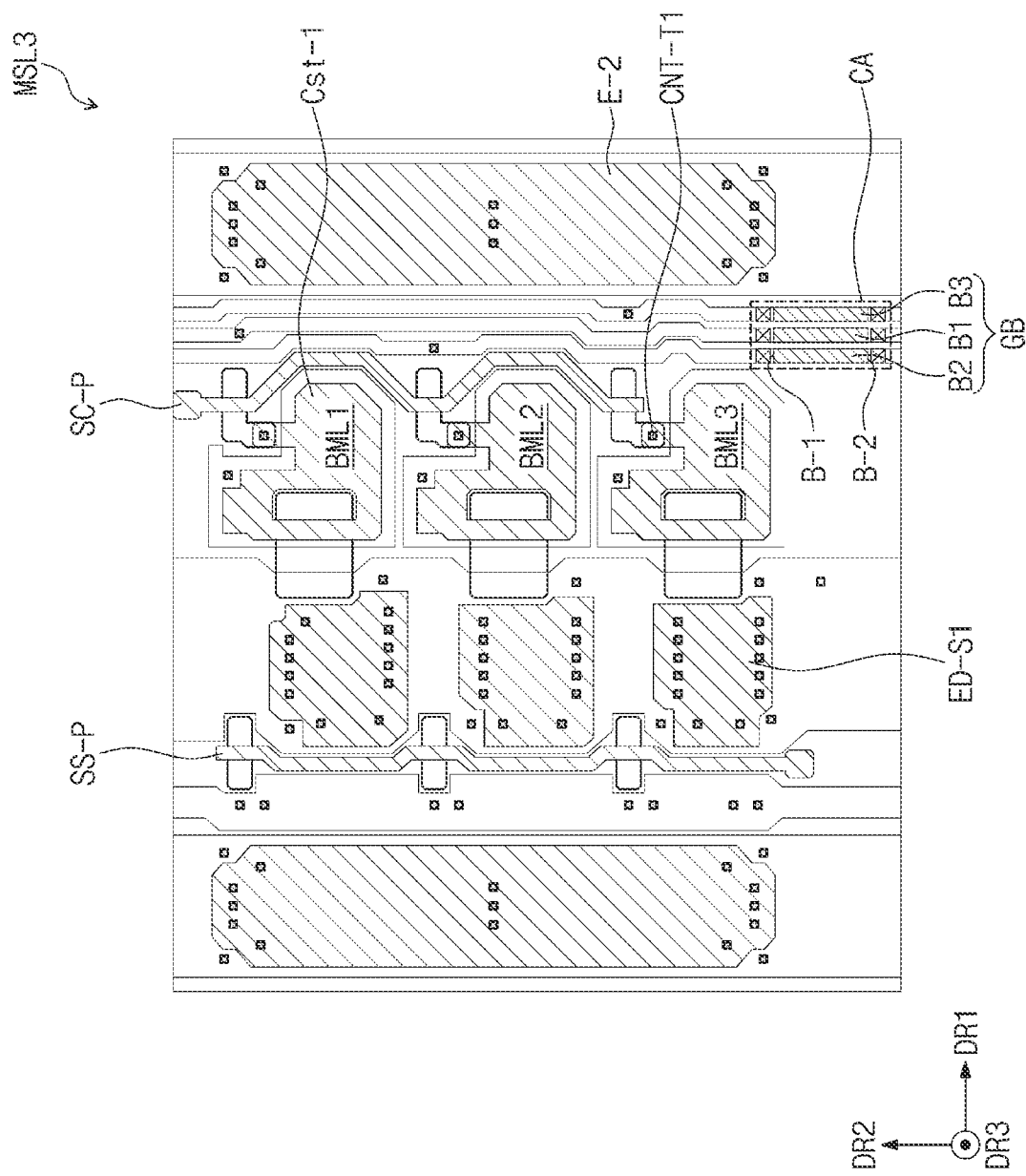

Referring to FIGS. 5 and 6E, the third conductive layer MSL3 may be disposed on the second insulating layer 20. The third conductive layer MSL3 may include a sensing pattern SS-P connected to the sensing line SSL of the fourth conductive layer MSL4, a scan pattern SC-P connected to the scan line SCL of the fourth conductive layer MSL4, an additional line E-2 of the second power line EL, and a first portion Cst-1 (a first pattern) of the capacitor Cst.

The third conductive layer MSL3 may include a first additional power pattern ED-S1. The first additional power pattern ED-S1 may be individually provided to each of the pixels. A portion of the first additional power pattern ED-S1, which overlaps the power pattern EBR, may be disposed in the first-1 power contact holes CNT-P1 and be connected to the power pattern EBR.

The additional line E-2 of the second power line EL may overlap the first line E-1. The additional line E-2 may be disposed on a layer that is different from the layers on which the data lines DL1, DL2, and DL3 are disposed. The additional line E-2 may extend along the second direction DR2. The first line E-1 and the additional line E-2 may be spaced apart from the data lines DL1, DL2, and DL3 on the plane. The additional line E-2 may be disposed in the first-1 additional contact holes CNT-A1 and be connected to the first line E-1.

According to the disclosure, the third conductive layer MSL3 may include gates provided in the first to third transistors T1, T2, and T3.

A portion of the third conductive layer MSL3, which overlaps the channel region A1 of the first transistor T1, may be defined as the gate G1 of the first transistor T1, and the remaining portion may be defined as a first portion Cst-1 of the capacitor Cst. The first portion Cst-1 may be disposed in the first gate contact hole CNT-T1 and be connected to the protrusion PP (see FIG. 7) protruding from the drain D2 of the second transistor T2.

The scan pattern SC-P overlapping the channel region A2 of the second transistor T2 may be defined as the gate G2 of the second transistor T2, and the sensing pattern SS-P overlapping the channel region A3 of the third transistor T3 may be defined as the gate G3 of the third transistor T3.

A reduction process of the semiconductor patterns provided in each of the first to third transistors T1, T2, and T3 may be performed using the gates G1, G2, and G3 as masks, and each of the source and drain may have conductivity greater than that of the channel region.

The sensing pattern SS-P may be disposed on a fourth conductive layer MSL4 to be described later and be connected to the sensing line SSL extending in the first direction DR1. The sensing pattern SS-P may extend in the second direction DR2.

The scan pattern SC-P may be disposed on a fourth conductive layer MSL4 to be described later and be connected to the scan line SCL extending in the first direction DR1. The scan pattern SC-P may extend in the second direction DR2.

According to this embodiment, the third conductive layer MSL3 may include a gate bridge GB. The gate bridge GB may be disposed on the crossing area CA, on which a scan line SCL, a first power line ED, and a sensing line SSL, which will be described later, cross (or intersect) each other. The gate bridge GB may be provided in plural to overlap each of the data lines DL1, DL2, and DL3.

For example, the gate bridges GB may include a first gate bridge B1 overlapping the first data line DL1, a second gate bridge B2 overlapping the second data line DL2, and the third gate bridge B3 overlapping the third data line DL3. Each of the gate bridges B1, B2, and B3 may extend in a direction in which the data lines DL1, DL2, and DL3 extend, for example, in a same direction as the second direction DR2.

The gate bridge GB may be provided in the bridge line BL together with a source bridge SB to be described later.

Each of the gate bridges B1, B2, and B3 may include one end or an end B-1 and the other end or another end B-2. The scan line SCL, the first power line ED, and the sensing line SSL, which will be described later, may be disposed between one end or an end B-1 and the other end or another end B-2.

The third conductive layer MSL3 may be covered by the third insulating layer 30.

Figure 6F:
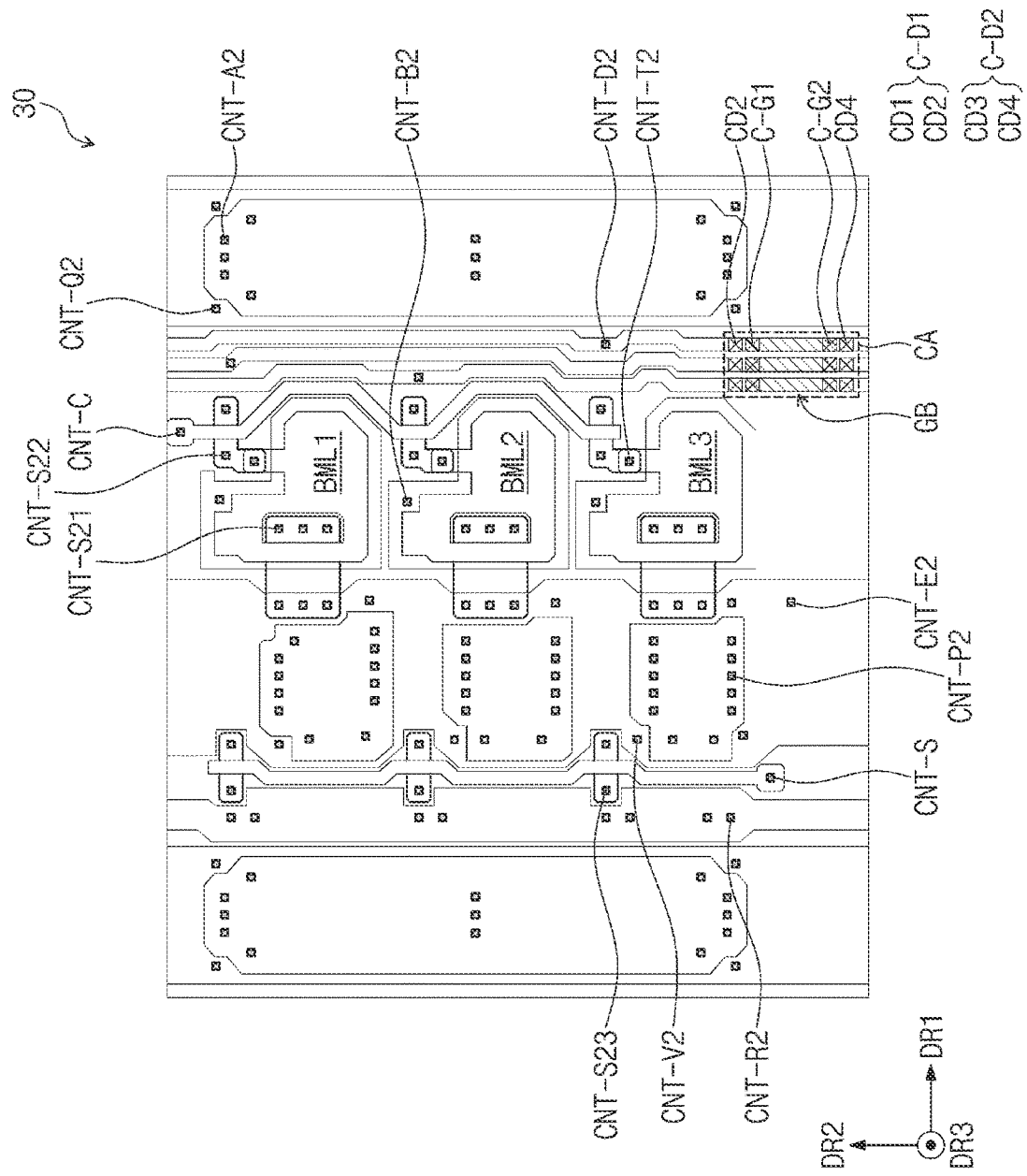

FIG. 6F illustrates contact holes defined in the third insulating layer 30. The third insulating layer 30 is disposed on the second insulating layer 20 to cover the third conductive layer MSL3. Contact holes passing through the third insulating layer 30 to expose a portion of the third conductive layer MSL3 may be defined in the third insulating layer 30.

Second initial contact holes CNT-R2 may overlap the first initial contact holes CNT-R1.

Second-1 additional contact holes CNT-A2 may expose a portion of the additional line E-2. Second-2 additional contact holes CNT-Q2 may expose a portion of the first line E-1.

A scan contact hole CNT-C may expose a portion of the scan pattern SC-P. A sensing contact hole CNT-S may expose a portion of the sensing pattern SS-P.

A second line contact hole CNT-E2 may overlap the first line contact hole CNT-E1. The first line contact hole CNT-E1 and the second line contact hole CNT-E2 may expose a portion of the power pattern EBR.

The second-1 additional contact holes CNT-A2 may overlap the first-1 additional contact holes CNT-A1. Second-1 additional contact holes CNT-A2 may expose a portion of the additional line E-2.

The second-2 additional contact holes CNT-Q2 may overlap the first-2 additional contact holes CNT-Q1. Second-2 additional contact holes CNT-Q2 may expose a portion of the first line E-1.

A second light blocking contact hole CNT-B2 may overlap the first light blocking contact hole CNT-B1. The second light blocking contact hole CNT-B2 may expose the corresponding light blocking patterns BML1, BML2, and BML3.

A second-1 power contact holes CNT-P2 may overlap the first-1 power contact holes CNT-P1. The second-1 power contact holes CNT-P2 may expose the corresponding first additional power patterns ED-S1.

A second-2 power contact holes CNT-V2 may overlap the first-2 power contact holes CNT-V1. The second-2 power contact holes CNT-V2 may expose a portion of the power pattern EBR.

A second line contact hole CNT-E2 may overlap the first line contact hole CNT-E1. The second line contact hole CNT-E2 may expose a portion of the power pattern EBR.

Second-1 semiconductor contact holes CNT-S21 may expose portions of the source S1 and the drain D1, which are provided in the first transistor T1.

Second-2 semiconductor contact holes CNT-S22 may expose portions of the source S2 and the drain D2, which are provided in the second transistor T2.

Second-3 semiconductor contact holes CNT-S23 may expose portions of the source S3 and the drain D3, which are provided in the third transistor T3.

A second gate contact hole CNT-T2 may expose a portion of the first portion Cst-1 of the capacitor Cst.

Second data contact holes CNT-D2 may overlap the first data contact holes CNT-D1. Second data contact holes CNT-D2 may expose a portion of the corresponding data line among the first to third data lines DL1, DL2, and DL3.

According to this embodiment, bridge contact holes C-D1, C-D2, C-G1, and C-G2 overlapping portions of the data lines DL1, DL2, and DL3 and the bridge lines BL may be defined in the third insulating layer 30.

The third insulating layer 30 may include a second hole CD2 and a fourth hole CD4. The second hole CD2 and the fourth hole CD4 may expose a portion of the corresponding data line among the first to third data lines DL1, DL2, and DL3. The second hole CD2 may overlap the first hole CD1 defined in the first insulating layer 10, and the fourth hole CD4 may overlap the third hole CD3 defined in the first insulating layer 10.

In the disclosure, the first-1 bridge contact hole C-D1 may be defined as including the first hole CD1 and the second hole CD2, and the first-2 bridge contact hole C-D2 may be defined as including the third hole CD3 and the fourth hole CD4.

The first-1 bridge contact hole C-D1 may overlap a portion of each of the data lines DL1, DL2, and DL3, which are respectively adjacent to the ends B-1 of the gate bridges B1, B2, and B3, and the first-2 bridge contact hole C-D2 may overlap a portion of each of the data lines DL1, DL2, and DL3, which are respectively adjacent to the other ends B-2 of the gate bridges B1, B2, and B3.

The second-1 bridge contact hole C-G1 may overlap a portion of each of the gate bridges B1, B2, and B3, which are respectively adjacent to the ends B-1 of the gate bridges B1, B2, and B3, and the second-2 bridge contact hole C-G2 may overlap a portion of each of the gate bridges B1, B2, and B3, which are respectively adjacent to the other ends B-2 of the gate bridges B1, B2, and B3.

The source bridge SB disposed on the fourth conductive layer MSL4, which will be described later, may connect the data lines DL1, DL2, and DL3 through the bridge contact holes C-D1, C-D2, C-G1, and C-G2. This will be described later.

Figure 6G:
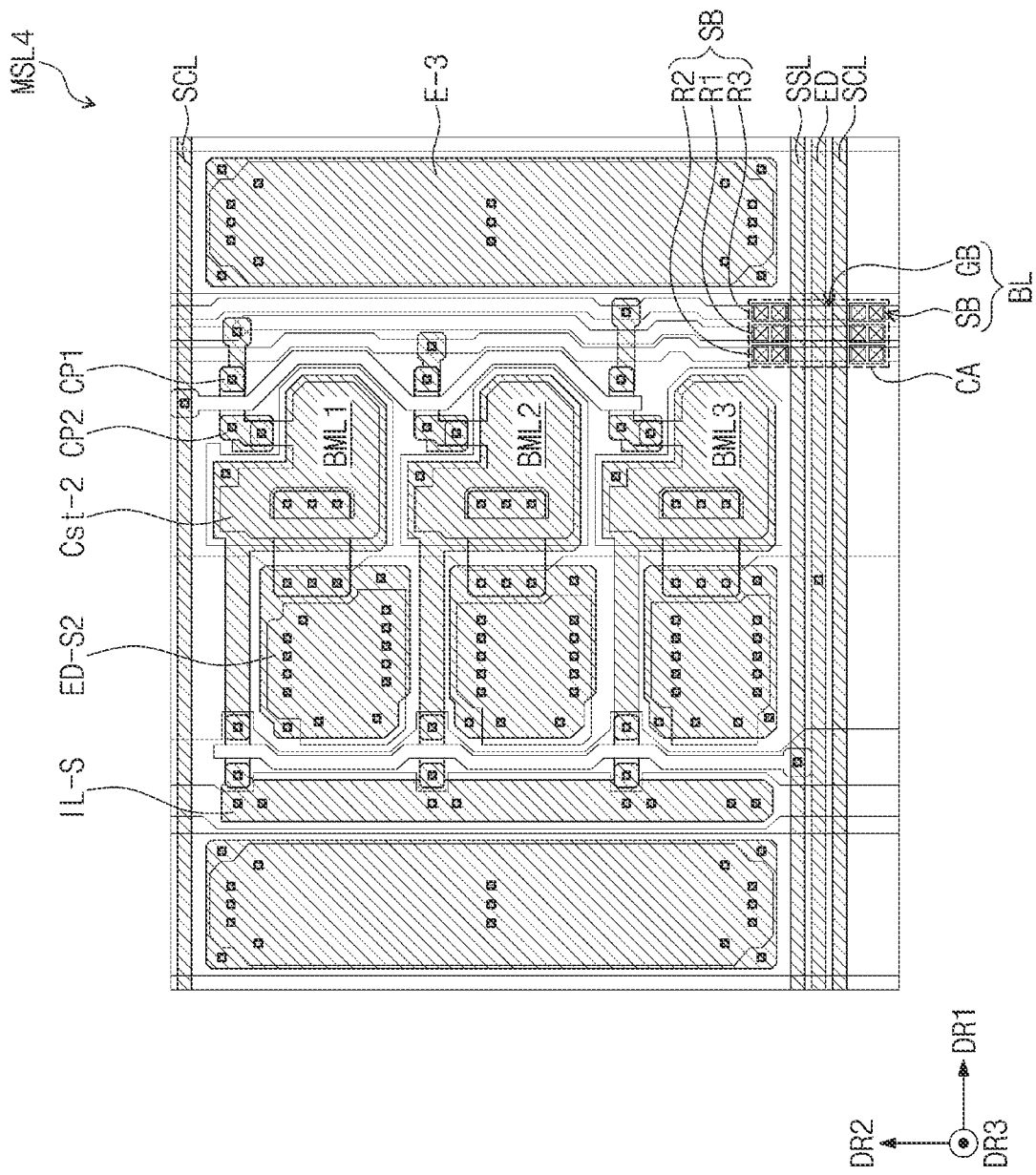

Referring to FIGS. 5 and 6G, the fourth conductive layer MSL4 may be disposed on the third insulating layer 30. The fourth conductive layer MSL4 may include a scan line SCL, a sensing line SSL, a first power line ED, a first sub-pattern CP1, a second sub-pattern CP2, a sub-initial line IL-S, and a second portion Cst-2 (second pattern) of the capacitor Cst.

The fourth conductive layer MSL4 may include a second line E-3 of the second power lines EL. The second line E-3 may overlap the first line E-1 and the additional line E-2 and extend in the second direction DR2.

The second line E-3 may be disposed in the second-1 additional contact holes CNT-A2 and be connected to the additional line E-2. The second line E-3 may be connected to the first line E-1 through the first-2 additional contact holes CNT-Q1 and the second-2 additional contact holes CNT-Q2.

The scan line SCL may be connected to the scan pattern SC-P through the scan contact hole CNT-C. For convenience of explanation, FIG. 6G illustrates a state in which the scan line SCL disposed at an upper end is connected to the scan pattern SC-P through the scan contact hole CNT-C, and the scan line SCL disposed at a lower end overlaps the scan pattern SC-P. However, the connection relationship between the scan line SCL and the scan pattern SC-P, which are disposed at the lower end is the same as that between the scan line SCL and the scan pattern SC-P disposed at the upper end.

The sensing line SSL may be connected to the sensing pattern SS-P through the sensing contact hole CNT-S.

Each of the scan line SCL, the sensing line SSL, and the first power line ED may extend in the first direction DR1, and the scan line SCL, the sensing line SSL, and the first power line ED may be spaced apart from each other in the second direction DR2.

The second additional power pattern ED-S2 may be provided in plural and may be disposed on the corresponding first additional power patterns ED-S1. The second additional power pattern ED-S2 may be disposed in the second-1 power contact holes CNT-P2 and be connected to the first additional power pattern ED-S1. The second additional power pattern ED-S2 may be disposed in the first-2 power contact holes CNT-V1 and the second-2 power contact holes CNT-V2 and be connected to the power pattern EBR.

A portion of the second portion Cst-2 of the capacitor Cst may be disposed in the first light blocking contact hole CNT-B1 and the second light blocking contact hole CNT-B2 and be connected to the corresponding light blocking pattern.

A portion of the second portion Cst-2 of the capacitor Cst may be disposed in the contact hole overlapping the source S1 of the first transistor T1 among the second-1 semiconductor contact holes CNT-S21 and be connected to the source S1 of the first transistor T1.

A portion of the second portion Cst-2 of the capacitor Cst may extend to the drain D3 of the third transistor T3. The second portion Cst-2 may be disposed in the contact hole overlapping the drain D3 among the second-3 semiconductor contact holes CNT-S23 to connect the first transistor T1 to the third transistor T3.

The first sub-pattern CP1 may connect the second transistor T2 to the corresponding data line of the data lines DL1, DL2, and DL3.

One end or an end of the first sub-pattern CP1 may overlap the source S2 of the second transistor T2 and be disposed in the contact hole that overlaps the source S2 of the second transistor T2 among the second-second semiconductor contact holes CNT-S22. The other end of the first sub-pattern CP1 may extend to the corresponding data line and be disposed in the first data contact hole CNT-D1 and the second data contact hole CNT-D2 so as to be connected to the corresponding data line. Thus, the second transistor T2 and the data line may be connected to each other through the first sub-pattern CP1.

One end or an end of the second sub-pattern CP2 may overlap the drain D2 of the second transistor T2 and be disposed in the contact hole that overlaps the drain D2 of the second transistor T2 among the second-2 semiconductor contact holes CNT-S22. The other end of the second sub-pattern CP2 may overlap the first portion Cst-1 of the capacitor Cst and may be disposed in the second gate contact hole CNT-T2.

The sub-initial line IL-S may overlap the initial line IL. The sub-initial line IL-S may be connected to the initial line IL through the first and second initial contact holes CNT-R1 and CNT-R2.

The fourth conductive layer MSL4 according to the disclosure may include a source bridge SB. According to this embodiment, the gate bridge GB and the source bridge SB provided in the third conductive layer MSL3 may be provided in the bridge line BL.

The source bridge SB may include first source bridges R1, second source bridges R2, and third source bridges R3.

The first to third source bridges R1, R2, and R3 may connect the first to third data lines DL1, DL2, and DL3 to the gate bridges B1, B2, and B3.

For example, any one of the first source bridges R1 may be disposed to overlap a portion of the first data line DL1 and a portion adjacent to one end or another end B-1 of the first gate bridge B1, and the other one of the first source bridges R1 may be disposed to overlap a portion of the first data line DL1 and a portion adjacent to the other end or another end B-2 of the first gate bridge B1.

Any one of the first source bridges R1 may be connected to the first data line DL1 and the first gate bridge B1 through the bridge contact holes C-D1 and C-G1, and the other one of the first source bridge R1 may be connected to the first data line DL1 and the first gate bridge B1 through the remaining bridge contact holes C-D2 and C-G2.

Thus, in the crossing area on which the scan line SCL, the first power line ED, and the sensing line SSL cross each other, the first data line DL1 may be connected by the first gate bridge B1 and the first source bridge R1, which are disposed on different layers.

The connection relationship between the second and third source bridges S2 and S3 and the second and third data lines DL2 and DL3 may be the same as the connection relationship between the first source bridge R1 and the first data line DL1.

In this embodiment, the conductive patterns provided in the fourth conductive layer MSL4 may be provided as layers. For example, the fourth conductive layer MSL4 may be provided as two-layered metal layers, in which titanium (Ti)/copper (Cu) are laminated or may be provided three-layered metal layers, in which titanium (Ti)/aluminum (Al)/ titanium (Ti) are laminated.

Figure 6H:
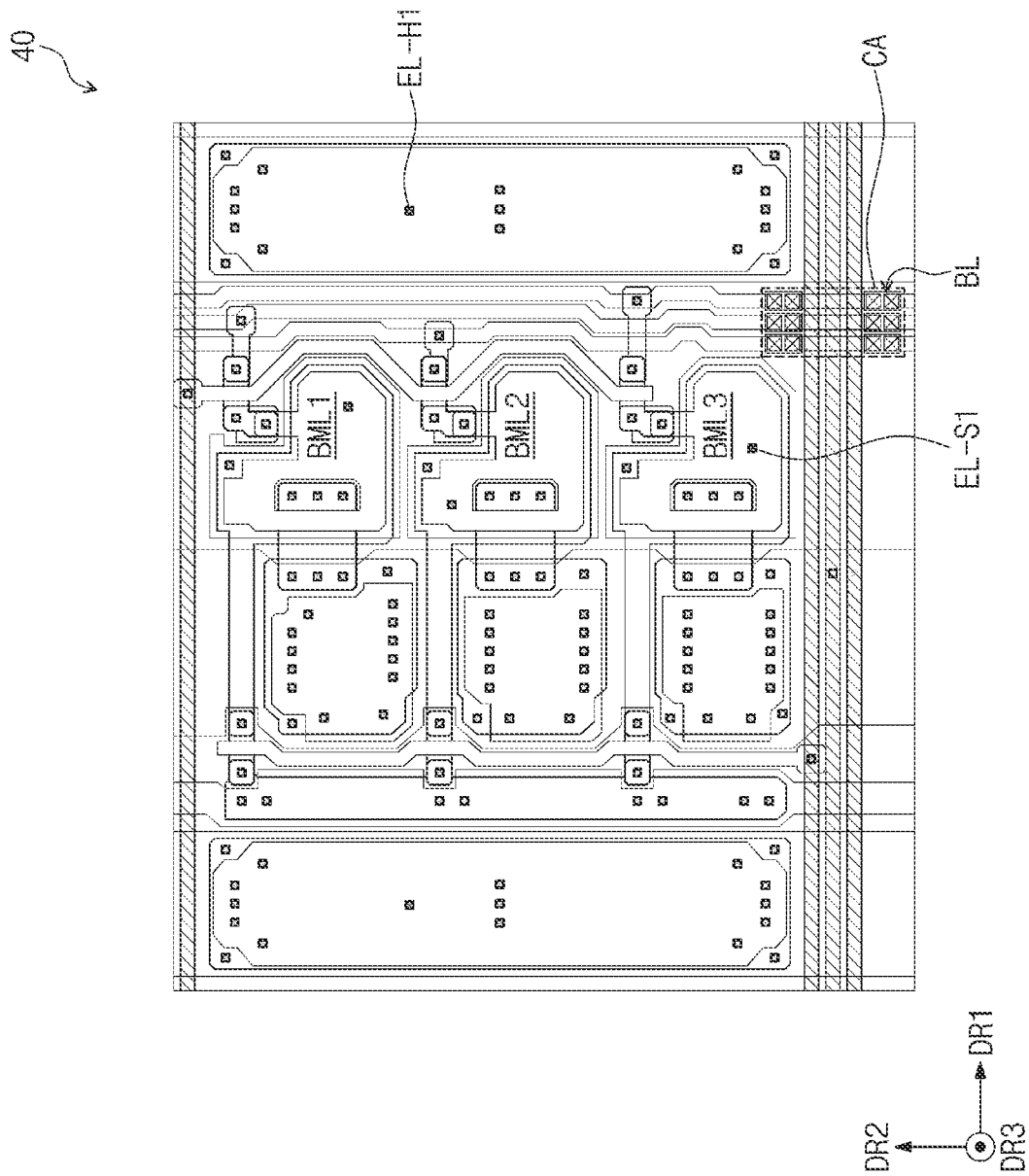
Figure 61:
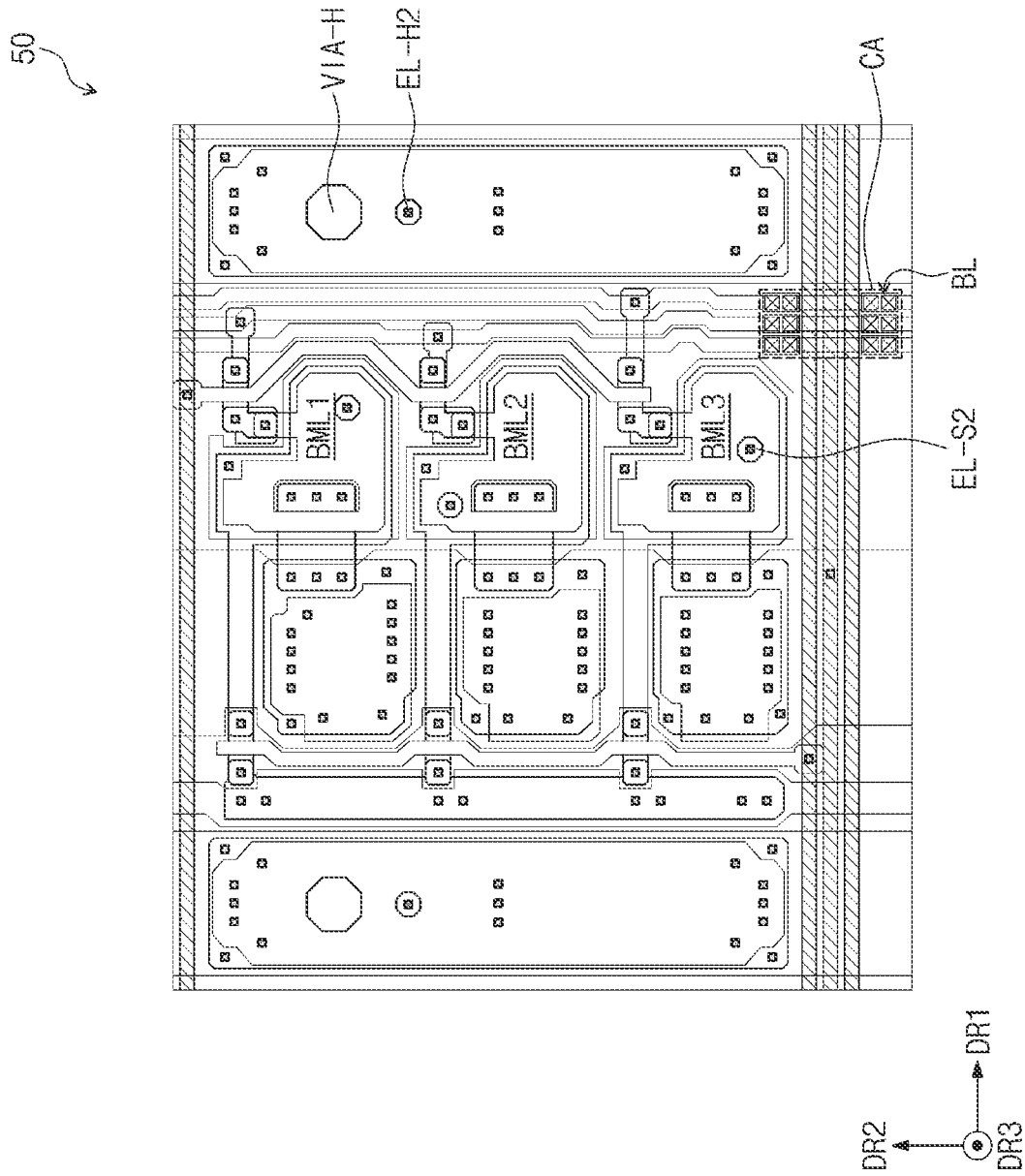
Figure 6K:
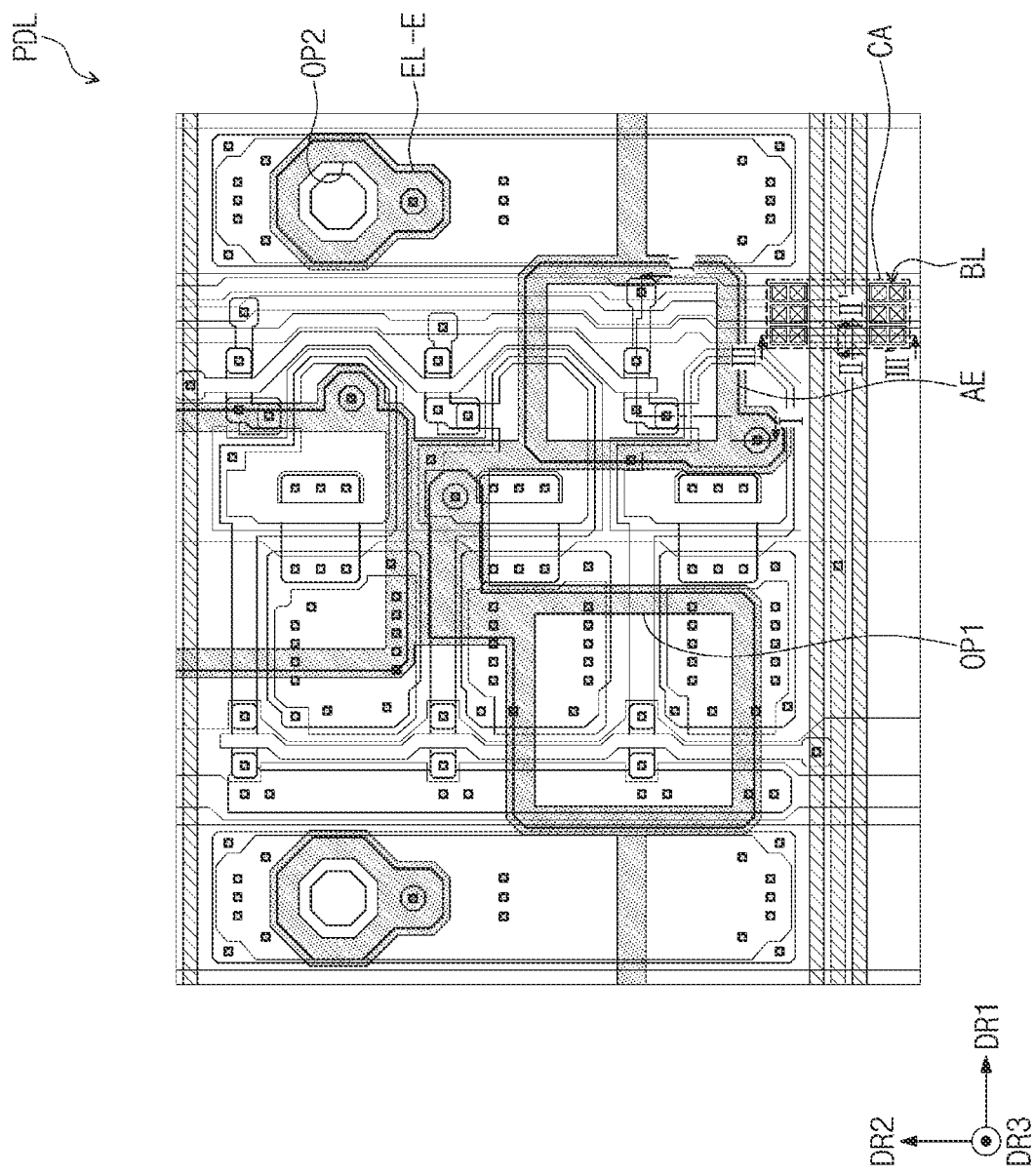

FIG. 6H illustrates the contact holes defined in the fourth insulating layer 40. The fourth insulating layer 40 is disposed on the third insulating layer 30 to cover the fourth conductive layer MSL4. Contact holes passing through the fourth insulating layer 40 to expose a portion of the fourth conductive layer MSL4 may be defined in the fourth insulating layer 40.

A first via contact hole EL-H1 may expose a portion of the second line E-3 of the first power line ED.

A first anode contact hole EL-S1 may expose a portion of the second portion Cst-2 of the capacitor Cst.

FIG. 6I illustrates contact holes defined in the fifth insulating layer 50. A fifth insulating layer 50 may be disposed on the fourth insulating layer 40. Contact holes passing through the fifth insulating layer 50 to overlap the contact holes defined in the fourth insulating layer 40 may be defined in the fifth insulating layer 50.

A second via contact hole EL-H2 may overlap the first via contact hole EL-H1. A surface area of the second via contact hole EL-H2 may be larger than that of the first via contact hole EL-H1. The first via contact hole EL-H1 and the second via contact hole EL-H2 may expose a portion of the second line E-3 of the first power line ED.

The second anode contact hole EL-S2 may overlap the first anode contact hole EL-S1. The first anode contact hole EL-S1 and the second anode contact hole EL-S2 may expose a portion of the second portion Cst-2 of the capacitor Cst.

A via hole VIA-H may overlap a portion of the second line E-3 of the first power line ED. A first electrode AE and a second electrode CE (see FIG. 7) of the light emitting element OLED may be connected to each other through the via holes VIA-H.

According to an embodiment, any one of the fourth insulating layer 40 and the fifth insulating layer 50 may be omitted. Thus, the fourth insulating layer 40 and the fifth insulating layer 50 may be provided as one insulating layer, and the above-described contact holes defined in the fourth insulating layer 30 and the above-described contact holes defined in the fifth insulating layer 50 may be defined in the one insulating layer, but are not limited to any one embodiment.

FIG. 6J illustrates a first electrodes AE and an electrode pattern EL-E provided in the light emitting element OLED (see FIG. 4) of each of the pixels. The first electrodes AE and the electrode pattern EL-E may be disposed on the fifth insulating layer 50.

The first electrode AE may be disposed in the first anode contact hole EL-S1 and the second anode contact hole EL-S2 and be connected to the second portion Cst-2 of the capacitor Cst.

Surface areas of the first electrodes AE provided in the pixels providing different light may be different from each other. For example, a surface area of the first electrode AE provided in the pixel providing second color light may be less than that of the first electrode AE provided in the pixel providing first color light and may be greater than that of the first electrode AE provided in the pixel providing third color light. The first color may be green, the second color may be red, and the third color may be blue.

However, the disclosure is not limited thereto, and the surface areas of the first electrodes AE may be the same. The color of the light provided according to the area of the first electrode AE may vary according to quality of the pixel, but is not limited to any one embodiment.

The electrode pattern EL-E may be disposed in the first via contact hole EL-H1 and the second via contact hole EL-H2 and be connected to the second line E-3 of the first power line ED.

FIG. 6K illustrates the pixel defining layer PDL. The pixel defining layer PDL may be disposed on the fifth insulating layer 50 and have a first opening OP1 exposing at least a portion of the first electrode AE and a second opening OP2 exposing at least a portion of the electrode pattern EL-E.

The pixel defining layer PDL may be patterned to surround edges of the first electrode AE and the electrode pattern EL-E. The pixel defining layer PDL according to an embodiment may cover a light blocking material.

An area of the first electrode AE, which is exposed by the first opening OP1, may be defined as an emission area PXA (see FIG. 7) to which light generated by the light emitting element OLED is substantially provided, and an area of the first electrode AE, which overlaps the pixel defining layer PDL, may be defined as a non-emission area NPXA (see FIG. 7).

Referring to FIG. 7, the display panel DP may include a base layer BS, a circuit element layer DP-CL disposed on the base layer BS, a display element layer DP-OLED, and a thin film encapsulation layer TFE. In FIG. 7, the window panel WD and the light control layer OSL, which are described in FIG. 2, are omitted.

The circuit element layer DP-CL may include first to fifth insulating layers 10, 20, 30, 40, and 50 and first to fourth conductive layers MSL1, MSL2, MLS3, and MLS4.

According to an embodiment, each of the first to fifth insulating layers 10, 20, 30, 40, and 50 may include any one of an inorganic layer and an organic layer.

The first to fifth insulating layers 10, 20, 30, 40, and 50 and the pixel defining layer PDL may correspond to the insulating layers described with reference to FIGS. 6B, 6D, 6F, 6H, 6I, and 6K, and the first to fourth conductive layers MSL1, MSL2, MLS3, and MLS4 may correspond to the conductive layers described with reference to FIGS. 6A, 6C, 6E, and 6G.

The display element layer DP-OLED may include a light emitting element OLED and a pixel defining layer PDL. The light emitting element OLED may include a first electrode AE, a hole control layer HCL, an emission layer EML, an electron control layer ECL, and a second electrode CE.

The first electrode AE of the light emitting element OLED is disposed on the fifth insulating layer 50. The first electrode AE may be an anode. The first electrode AE provided in each of the pixels may correspond to the first electrode AE described with reference to FIG. 6J.

The pixel defining layer PDL is disposed on the fifth insulating layer 50. The first opening OP1 of the pixel defining layer PDL exposes at least a portion of the first electrode AE. The first opening OP1 of the pixel defining layer PDL may be defined as the emission area PXA through which light is substantially provided. A periphery of the emission area PXA may be defined as a non-emission area NPXA.

A hole control layer HCL may be commonly disposed on the emission area PXA and the non-emission area NPXA. A common layer such as the hole control layer HCL may be commonly provided in the pixels PX. The hole control layer HCL may include a hole transport layer and a hole injection layer.

The emission layer EML is disposed on the hole control layer HCL. The emission layer EML may be disposed on only an area corresponding to the first opening OP1. The emission layer EML may be provided to be separated from each other in the pixels PX.

Although the patterned emission layer EML is illustrated as an example in the current embodiment, the emission layer EML may be commonly disposed on the pixels PX.

The commonly disposed emission layer EML may generate white light or blue light. Also, the emission layer EML may have a multilayer structure.

An electronic control layer ECL is disposed on the emission layer EML. The electronic control layer ECL may include an electron transport layer and an electron injection layer. The second electrode CE is disposed on the electron control layer ECL. The electronic control layer ECL and the second electrode CE are commonly provided in the pixels PX.

The second electrode CE may be disposed in the second opening OP2 and be connected to the electrode pattern EL-E. Thus, the second electrode CE may commonly provide the second voltage ELVSS to the pixels.

The thin film encapsulation layer TFE is disposed on the second electrode CE. The thin film encapsulation layer TFE is commonly disposed on the pixels PX. In a current embodiment, the thin film encapsulation layer TFE covers or directly covers the second electrode CE.

The thin film encapsulation layer TFE may include at least one or more inorganic layers and an organic layer. For example, the thin film encapsulation layer TEF may include two inorganic layers and an organic layer disposed between the two or more inorganic layers.

The inorganic layers may include a silicon nitride layer, a silicon oxy nitride layer, a silicon oxide layer, a titanium oxide layer, or an aluminum oxide layer. The organic layer may include an acrylic-based organic layer, but the embodiment is not limited thereto.

The light blocking pattern BML3 and the data lines DL1, DL2, and DL3 are disposed on the base layer BS and covered by the first insulating layer 10.

The first insulating layer 10 may be disposed on the base layer BS to cover the light blocking pattern BML3 and the data lines DL1, DL2, and DL3. A first data contact hole CNT-D1 exposing a portion of each of the data lines DL1, DL2, and DL3 may be defined in the first insulating layer 10.

The source S2, the channel region A2, the drain D2, and the protrusion PP protruding from the drain D2 of the second transistor T2 may be disposed on the first insulating layer 10.

The second insulating layer 20 may overlap the protrusion PP and the channel region A2. A first gate contact hole CNT-T1 may be defined in an area of the second insulating layer 20, which overlaps the protrusion PP. The first gate contact hole CNT-T1 exposes a portion of the protrusion PP.

The gate G2 of the second transistor T2 is disposed on an area of the second insulating layer 20, which overlaps the channel region A2.

The first portion Cst-1 of the capacitor Cst may be disposed on the second insulating layer 20 and disposed in the first gate contact hole CNT-T1 so as to be connected to the protrusion PP.

The third insulating layer 30 may cover the first portion Cst-1 of the capacitor Cst and the gate G2. The third insulating layer 30 may include a second gate contact hole CNT-T 2, second-2 semiconductor contact holes CNT-S22, and second data contact holes CNT-D2.

The second gate contact hole CNT-T2 may expose a portion of the first portion Cst-1 of the capacitor Cst. One of the second-2 semiconductor contact holes CNT-S22 exposes a portion of the source S2 provided in the second transistor T2, and the other one of the second-2 semiconductor contact holes CNT-S22 exposes a portion of the drain D2 provided in the second transistor T2.

The second portion Cst-2 of the capacitor Cst, the first sub-pattern CP1, and the second sub-pattern CP2 may be disposed on the third insulating layer 30.

One end or an end of the first sub-pattern CP1 may be disposed in the first data contact hole CNT-D1 and the second data contact holes CNT-D2 and be connected to the third data line DL3. The other end or another end of the first sub-pattern CP1 may be disposed in a contact hole of the second-2 semiconductor contact holes CNT-S22, which overlaps the source S2 and be connected to the source S2. Thus, the second transistor T2 may be connected to the third data line DL3 through the first sub-pattern CP1.

One end or an end of the second sub-pattern CP2 may be disposed in the second gate contact hole CNT-T2 and be connected to the drain D2 of the second transistor T2. The other end or another end of the second sub-pattern CP2 may be disposed in a contact hole of the second-second semiconductor contact holes CNT-S22, which overlaps the drain D2, and be connected to the drain D2.

The fourth insulating layer 40 may be disposed on the third insulating layer 30 to cover the second portion Cst-2 of the capacitor Cst, the first sub-pattern CP1, and the second sub-pattern CP2. The fourth insulating layer 40 may have a first anode contact hole EL-S1 exposing a portion of the second portion Cst-2 of the capacitor Cst.

The fifth insulating layer 50 may be disposed on the fourth insulating layer 40 and may have a second anode contact hole EL-S2 overlapping the first anode contact hole EL-S1.

The first electrode AE may be disposed in the first anode contact hole EL-S1 and the second anode contact hole EL-S2 and be connected to the second portion Cst-2 of the capacitor Cst.

FIGS. 8 and 9 illustrate the layers up to only the fourth conductive layer MSL4 disposed on the third insulating layer 30, and the layers after the fourth insulating layer 40 are omitted.

Referring to FIGS. 8 and 9, in the crossing area CA, the second data line DL2 may overlap the second gate bridge B2. The second gate bridge B2 may be disposed on the second insulating layer 20. As the second insulating layer 20 is patterned using the second gate bridge B2 as a mask, a shape of the second insulating layer 20 may be similar to that of the second gate bridge B2 on the plane.

Any one of the second source bridges R2 may be disposed to overlap one end or an end of each of the second data line DL2 and the second gate bridge B2 and be connected to the second data line DL2 and the second gate bridge B2 through the bridge contact holes C-D1 and C-G1.

The first-1 bridge contact holes C-D1 may include a first hole CD1 defined in the first insulating layer 10 and a second hole CD2 defined in the third insulating layer 30 and overlapping the first hole CD1.

The other one of the second source bridges R2 may be disposed to overlap the other end of each of the second data line DL2 and the second gate bridge B2 and be connected to the second data line DL2 and the second gate bridge B2 through the bridge contact holes C-D2 and C-G2.

The first-2 bridge contact holes C-D2 may include a third hole CD3 defined in the first insulating layer 10 and a fourth hole CD4 defined in the third insulating layer 30 and overlapping the third hole CD3.

According to the disclosure, the second data line DL2 may be connected through the bridge line BL on the crossing area CA (see FIG. 5). The bridge line BL may include a second gate bridge B2 and second source bridges R2, which are disposed on different layers. A connection relationship between the first and third data lines DL1 and DL3 on the crossing area CA may be the same as that of the second data line DL2.

A repair process may be performed on the data lines DL1, DL2, and DL3 provided on the first conductive layer MSL1 to prevent short circuit from occurring in case that defects occur on the area on which the scan line SCL and the sensing line SSL cross each other after the first insulation layer 10 is formed.

In the repair process, an ink repair process may be performed on cracked portions of the data lines DL1, DL2, and DL3 on the crossing area CA (see FIG. 5). Here, ink may include a material in which a metal is melted.

In case that the third insulating layer 30 is formed on the portion on which the repair process is performed, a step coverage of the portion on which the repair process is performed may not be good, and thus, the data lines DL1, DL2, and DL3 may be exposed from the first and third insulating layers 10 and 30 on the crossing area CA.

Here, in case that the scan line SCL and the sensing line SSL are formed on the exposed data lines DL1, DL2, and DL3, the short circuit may occur between the data lines DL1, DL2, DL3, the scan line SCL, and the sensing line SSL.

According to the disclosure, the data lines DL1, DL2, and DL3 may be connected through the bridge line BL on the area on which the scan line SCL and the sensing line cross the data lines DL1, DL2, and DL3, and thus, a separate repair process for the data lines DL1, DL2, and DL3 on the crossing area CA may be omitted.

Thus, the short circuit may be previously prevented from occurring between the scan line SCL and the sensing line SSL, which extend in a direction crossing the direction in which the data lines DL1, DL2, and DL3 extend, to provide the display panel DP having improved reliability.

The data lines DL1, DL2, and DL3 may be connected through the bridge lines BL disposed on different layers on the crossing area CA to provide double lines, thereby reducing a resistance value of each of the data lines DL1, DL2 and DL3.

Figure 10A:
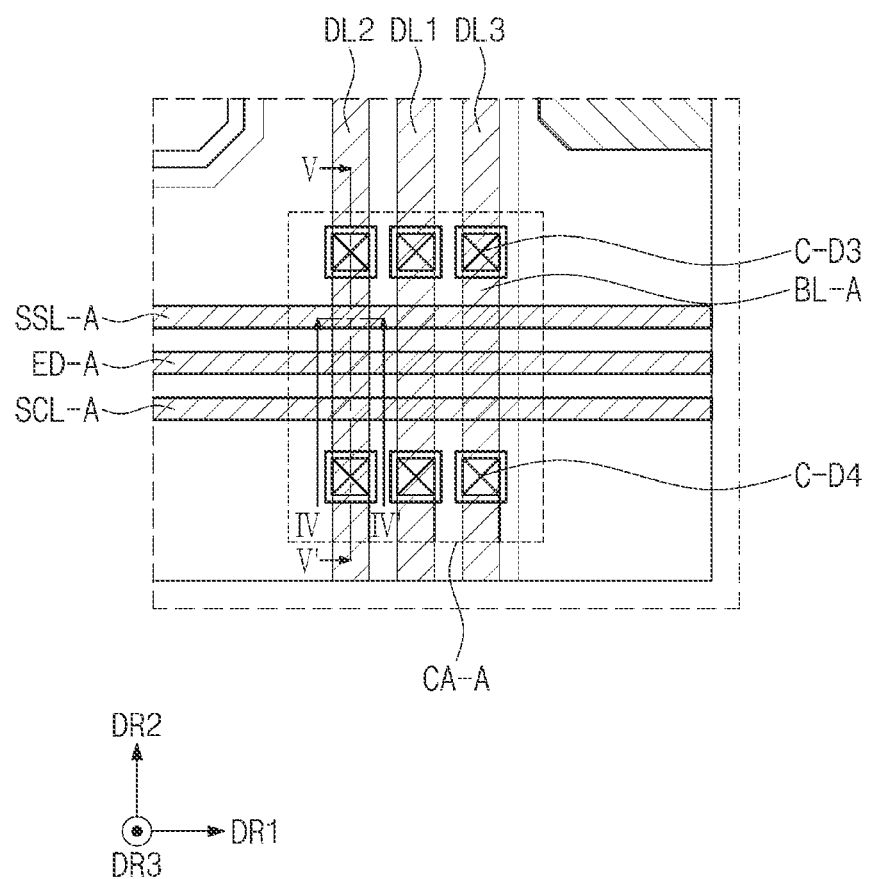
FIG. 10A is an enlarged schematic plan view illustrating one area of the unit pixel according to an embodiment.
Figure 10B:
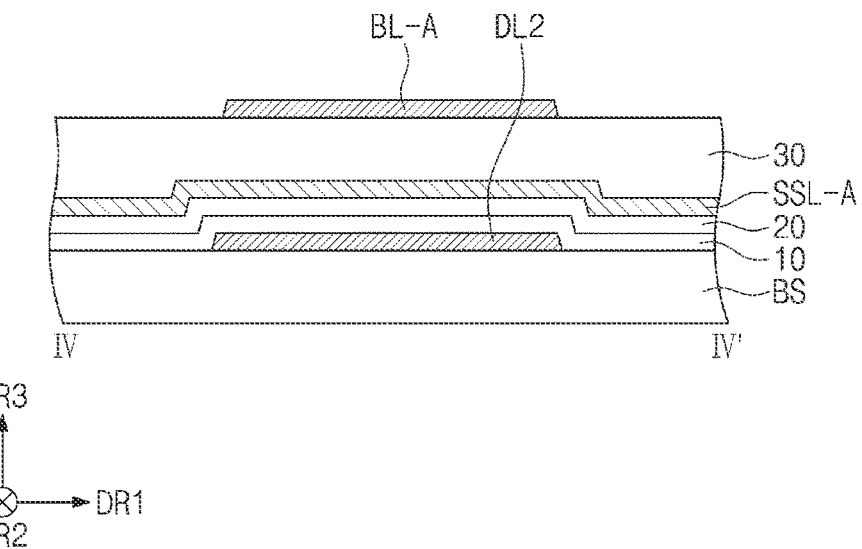
FIG. 10B is a schematic cross-sectional view taken along line VI-VI' of FIG. 10A.
Figure 10C:
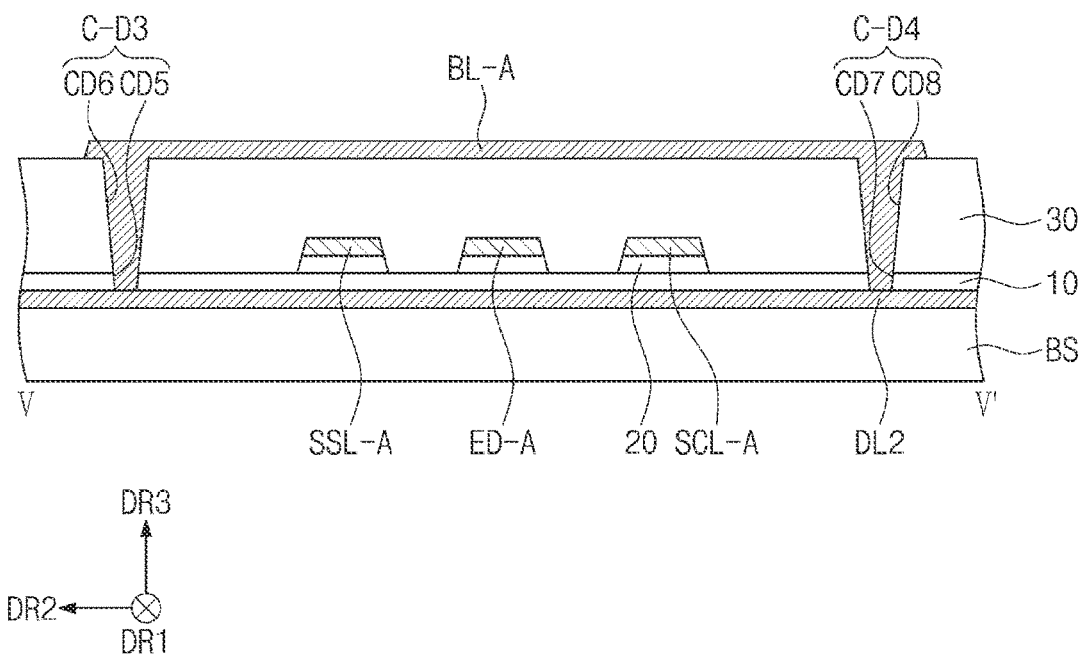
FIG. 10C is a schematic cross-sectional view taken along line V-V' of FIG. 10A.

FIG. 10A is an enlarged plan view illustrating one area or an area of the unit pixel according to an embodiment. FIG. 10B is a schematic cross-sectional view taken along line VI-VI' of FIG. 10A. FIG. 10C is a schematic cross-sectional view taken along line V-V' of FIG. 10A. The same/similar reference numerals are used for the same/similar configurations as in FIGS. 5 to 9, and redundant descriptions are omitted. FIG. 7 illustrates the layers up to only the fourth conductive layer MSL4 disposed on the third insulating layer 30, and the layers after the fourth insulating layer 40 are omitted.

Referring to FIGS. 10A to 10C, each of the data lines DL1, DL2, and DL3 extends in the second direction DR2, and each of a scan line SCL-A, a first power line ED-A, and a sensing lines SSL-A extends in the first direction DR1. The data lines DL1, DL2, and DL3 may have a crossing area CA-A overlapping the scan line SCL-A, the first power line ED-A, and the sensing line SSL-A.

The data lines DL1, DL2, and DL3 may be connected by a bridge line BL-A on the crossing area CA-A. One end or an end and the other end or another end of the bridge line BL-A may be connected to the data lines DL1, DL2, and DL3 through bridge contact holes C-D3 and C-D4.

The scan line SCL-A, the first power line ED-A, and the sensing line SSL-A according to this embodiment may be disposed on the second insulating layer 20, and the bridge line BL-A may be disposed on the third insulating layer 30.

In this embodiment, the bridge line BL-A may be connected to or directly connected to the second data line DL2. One end or an end of the bridge line BL-A is connected to one end or an end of the second data line DL2 through the third bridge contact hole C-D3, and the other end or another end of the bridge line BL-A is connected to the second data line DL2 through the other end of the fourth bridge contact hole C-D4.

The third bridge contact holes C-D3 may include a fifth hole CD5 defined in the first insulating layer 10 and a sixth hole CD6 defined in the third insulating layer 30 and overlapping the fifth hole CD5.

The fourth bridge contact holes C-D4 may include a seventh hole CD7 defined in the first insulating layer 10 and an eighth hole CD8 defined in the third insulating layer 30 and overlapping the seventh hole CD7.

According to this embodiment, the scan line SCL-A, the first power line ED-A, and the sensing line SSL-A may be connected to the data lines DL1, DL2, and DL3 through the bridge line BL-A disposed a different layer on a crossing area CA-A, and thus, the short circuit occurring between the data lines DL1, DL2, and DL3 and the scan line SCL-A, the first power line ED-A, and the sensing line SSL-A may be reduced.

FIG. 11A is an enlarged plan view illustrating one area or an area of the unit pixel according to an embodiment. FIG. 11B is a schematic cross-sectional view taken along line VI-VI' of FIG. 11A. FIG. 11C is a schematic cross-sectional view taken along line VII-VII' of FIG. 11A.

Referring to FIG. 11A, according to an embodiment, each of the data lines DL1, DL2, and DL3 extends in the second direction DR2, and each of a scan line SCL, a first power line ED, and a sensing lines SSL extends in the first direction DR1. The data lines DL1, DL2, and DL3 may have a crossing area CA-B overlapping the scan line SCL, the first power line ED, and the sensing line SSL.

The data lines DL1, DL2, and DL3 may be connected by a bridge line BL-B. One end or an end and the other end or another end of the bridge line BL-B may connect the data lines DL1, DL2, and DL3 through bridge contact holes C-D5 and C-D6.

Referring to FIGS. 11A and 11B, the scan line SCL, the first power line ED, and the sensing line SSL according to this embodiment may be disposed on the third insulating layer 30, and the bridge line BL-B may be disposed on the second insulating layer 20.

The bridge line BL-B may be connected to or directly connected to the second data line DL2. One end or an end of the bridge line BL-B is connected to one end or an end of the second data line DL2 through the fifth bridge contact hole C-D5, and the other end or another end of the bridge line BL-B is connected to the other end or another end of the second data line DL2 through the sixth bridge contact hole C-D6.

The fifth bridge contact holes C-D5 may include a ninth hole CD9 defined in the first insulating layer 10 and a tenth hole CD10 defined in the second insulating layer 20 and overlapping the ninth hole CD9.

The sixth bridge contact holes C-D6 may include an eleventh hole CD11 defined in the first insulating layer 10 and a twelfth hole CD12 defined in the second insulating layer 20 and overlapping the eleventh hole CD11.

According to this embodiment, the scan line SCL, the first power line ED, and the sensing line SSL may be connected to the data lines DL1, DL2, and DL3 through the bridge line BL-B disposed a different layer on a crossing area CA-B, and thus, the short circuit occurring between the data lines DL1, DL2, and DL3 and the scan line SCL, the first power line ED, and the sensing line SSL may be reduced.

According to the disclosure, even if the open failure of the data lines occurs on the area on which the data lines cross the scan line, the sensing line, or the power line, the separate repair process may be omitted. Therefore, the short defects occurring between the data lines and the scan line, between the data lines and the sensing line, and between the data lines and the power line may be reduced through the repair process on the crossing area to provide the display panel having the improved reliability.

It will be apparent to those skilled in the art that various modifications and variations can be made in the disclosure. Thus, it is intended that the disclosure covers the modifications and variations within the scope of the appended claims and their equivalents.

Accordingly, the technical scope of the disclosure should not be limited to the contents described in the detailed description of the specification, but should also be determined by the claims.

What is claimed is:

1. A display panel comprising:
   a base layer;
   pixels comprising:
   transistors, each of the transistors comprising a semiconductor pattern and a gate; and
   light emitting elements electrically connected to the transistors;

data lines electrically connected to corresponding pixels, spaced apart from each other in a first direction, and extending in a second direction intersecting the first direction;
bridge lines electrically connected to the data lines; and
scan lines and sensing lines electrically connected to the pixels, spaced apart from each other in the second direction, and extending in the first direction,
wherein the bridge lines extend in the second direction and overlap the data lines in a plan view in an area in which the scan lines and the sensing lines intersect the data lines.

2. The display panel of claim 1, wherein each of the bridge lines comprises:
a gate bridge having an end and another end, opposite to the end with the scan lines and the sensing lines disposed between the end and the another end in the second direction;
a first source bridge overlapping the data line adjacent to the end and the gate bridge adjacent to the end in a plan view and electrically connected to the data line adjacent to the end and the gate bridge; and
a second source bridge overlapping the data line adjacent to the another end and the gate bridge adjacent to the another end in a plan view and electrically connected to the data line adjacent to the another end and the gate bridge.

3. The display panel of claim 2, wherein the gate bridge and the gate comprise a same material.

4. The display panel of claim 2, wherein the first source bridge, the second source bridge, and the scan lines comprises a same material.

5. The display panel of claim 2, wherein the first source bridge and the second source bridge are spaced apart from each other with the scan lines and the sensing lines disposed between the first source bridge and the second source bridge in the second direction.

6. The display panel of claim 1, wherein
each of the bridge lines has an end and another end with the scan lines and the sensing lines disposed between the end and the another end in the second direction, and
each of the bridge lines is directly electrically connected to a portion of the data lines, adjacent to the end, and a portion of the data lines, adjacent to the another end.

7. The display panel of claim 6, wherein each of the bridge lines and the gate comprise a same material.

8. The display panel of claim 6, wherein
each of the scan lines and the sensing lines and the gate comprise a same material, and
each of the bridge lines comprises a material different from that of the gate.

9. The display panel of claim 1, further comprising:
insulating layers disposed on the base layer,
wherein the insulating layers comprise:
a first insulating layer disposed on the base layer to cover the data lines;
a second insulating layer disposed on the first insulating layer to cover the semiconductor pattern;
a third insulating layer disposed on the second insulating layer; and
a fourth insulating layer disposed on the third insulating layer to cover the scan lines and the sensing lines.

10. The display panel of claim 9, wherein
each of the bridge lines comprise:
a gate bridge overlapping the data lines in a plan view, disposed on the second insulating layer and covered by the third insulating layer; and
a source bridge disposed on the third insulating layer and covered by the fourth insulating layer,
a portion of the source bridge, overlapping the gate bridge in a plan view, is electrically connected to the gate bridge through a contact hole in the third insulating layer, and
a portion of the source bridge, overlapping the data lines in a plan view, is electrically connected to the data lines through contact holes in the third insulating layer and the first insulating layer.

11. The display panel of claim 9, wherein the bridge lines overlap the data lines in a plan view, are disposed on the second insulating layer and are covered by the third insulating layer, and are directly electrically connected to the data lines through contact holes in the first insulating layer and the second insulating layer with the scan lines and the sensing lines disposed between the first insulating layer and the second insulating layer.

12. The display panel of claim 9, wherein
the transistors comprise a first transistor, a second transistor, and a third transistor, and
the display panel comprises a light blocking pattern disposed on the base layer, covered by the first insulating layer, and overlapping at least a portion of a semiconductor pattern of the first transistor in a plan view.

13. The display panel of claim 12, further comprising:
a capacitor comprising a first pattern disposed on the second insulating layer and a second pattern,
a first sub pattern disposed on the fourth insulating layer and electrically connecting a corresponding data line of the data lines and the second transistor, and
a second sub pattern disposed on the fourth insulating layer and electrically connecting the second transistor and the first pattern of the capacitor.

14. The display panel of claim 10, wherein a portion of the second insulating layer has a shape corresponding to a shape of the gate bridge on a plane.

15. The display panel of claim 1, further comprising:
insulating layers disposed on the base layer, wherein
the insulating layers comprise:
a first insulating layer disposed on the base layer and covering the data lines;
a second insulating layer disposed on the first insulating layer and covering the semiconductor pattern;
a third insulating layer disposed on the second insulating layer and covering the gate, the scan lines, and the sensing lines; and
a fourth insulating layer disposed on the third insulating layer and covering the bridge lines, and
the bridge lines are directly electrically connected to the data lines through contact holes in the first insulating layer and the third insulating layer.

16. A display panel comprising:
a first transistor, a second transistor, and a third transistor, each of the first transistor, the second transistor, and the third transistor comprising a semiconductor pattern and a gate;
a light emitting element electrically connected to the first transistor;
a scan line electrically connected to the second transistor and extending in a first direction;
a sensing line electrically connected to the third transistor and extending in the first direction, the sensing line spaced apart from the scan line in a second direction intersecting the first direction;

a data line electrically connected to the second transistor and extending in the second direction intersecting the first direction; and a bridge line electrically connected to the data line, wherein an area in which the data line intersects the scan line and the sensing line overlaps in a plan view an area in which the bridge line intersects the scan line and the sensing line.

17. The display panel of claim 16, wherein the bridge line comprises:
- a gate bridge having an end and another end, opposite to the end with the scan line and the sensing line disposed therebetween in the second direction;
- a first source bridge that overlaps in a plan view a portion of the data line adjacent to the end and the gate bridge adjacent to the end and electrically connected to the portion of the data line and the gate bridge; and
- a second source bridge that overlaps in a plan view another portion of the data line adjacent to the another end and the gate bridge adjacent to the another end and electrically connected to the another portion of the data line and the gate bridge.

18. The display panel of claim 17, wherein the gate bridge and the gate are disposed on a same layer.

19. The display panel of claim 18, wherein the first source bridge, the second source bridge, and the scan line are disposed on a same layer.

20. The display panel of claim 16, wherein
the bridge line has an end and another end, with the scan line and the sensing line disposed between the end and the another end in the second direction, and the bridge line is directly electrically connected to a portion of the data line, adjacent to the end, and a portion of the data line, adjacent to the another end.

21. The display panel of claim 20, wherein the bridge line and the gate are disposed on a same layer.

22. The display panel of claim 20, wherein
the scan line, the sensing line, and the gate are disposed on a same layer, and the bridge line and the gate are disposed on a different layer.

* * * * *